(12) United States Patent
Shin et al.

(10) Patent No.: US 12,550,533 B2
(45) Date of Patent: Feb. 10, 2026

(54) DISPLAY PANEL WITH OPENINGS IN CORNERS, DISPLAY DEVICE INCLUDING THE DISPLAY PANEL AND ELECTRONIC DEVICE INCLUDING THE DISPLAY DEVICE

(71) Applicant: SAMSUNG DISPLAY CO., LTD., Yongin-si (KR)

(72) Inventors: Hosik Shin, Yongin-si (KR); Sangwoo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 972 days.

(21) Appl. No.: 17/721,791

(22) Filed: Apr. 15, 2022

(65) Prior Publication Data

US 2023/0034664 A1 Feb. 2, 2023

(30) Foreign Application Priority Data

Jul. 30, 2021 (KR) ........................ 10-2021-0100685

(51) Int. Cl.
*H01L 51/52* (2006.01)
*H10K 59/122* (2023.01)
*H10K 59/80* (2023.01)

(52) U.S. Cl.
CPC ......... *H10K 59/122* (2023.02); *H10K 59/873* (2023.02)

(58) Field of Classification Search
CPC ... H10K 59/122; H10K 50/844; H10K 59/873
See application file for complete search history.

(56) References Cited

U.S. PATENT DOCUMENTS

| | | | |
|---|---|---|---|
| 7,180,198 B2 | 2/2007 | Kim | |
| 9,142,808 B2 | 9/2015 | Kim et al. | |
| 9,305,508 B2 | 4/2016 | Park et al. | |
| 10,553,833 B2 | 2/2020 | Kim | |
| 2018/0006096 A1* | 1/2018 | Choi | B32B 27/365 |
| 2019/0081273 A1* | 3/2019 | Sung | H10K 59/8731 |
| 2020/0176696 A1* | 6/2020 | Dai | H10K 50/841 |
| 2020/0350393 A1 | 11/2020 | Lhee et al. | |
| 2021/0384465 A1 | 12/2021 | Park et al. | |
| 2022/0093698 A1* | 3/2022 | Paek | H10K 59/18 |
| 2022/0209148 A1 | 6/2022 | Park et al. | |
| 2022/0308625 A1* | 9/2022 | Gao, Sr. | G06F 1/1652 |
| 2023/0111683 A1* | 4/2023 | Wang | G06F 1/1652 |
| | | | 345/55 |

FOREIGN PATENT DOCUMENTS

| | | |
|---|---|---|
| KR | 101966688 B1 | 4/2019 |
| KR | 1020190045961 A | 5/2019 |
| KR | 1020190090905 A | 8/2019 |
| KR | 1020200124352 A | 11/2020 |
| KR | 1020210151634 A | 12/2021 |

* cited by examiner

*Primary Examiner* — Peter Bradford
(74) *Attorney, Agent, or Firm* — CANTOR COLBURN LLP

(57) ABSTRACT

A display panel includes a substrate including a central area and a corner area on an outer side of the central area, a plurality of pixels arranged on the substrate and including a first pixel, a second pixel, a third pixel, and a fourth pixel which overlap the corner area, and an inorganic layer defining a first opening, which is arranged between the first pixel and the second pixel, and a second opening, which is arranged between the third pixel and the fourth pixel, where a shape of the first opening is different from a shape of the second opening.

20 Claims, 14 Drawing Sheets

DISPLAY PANEL WITH OPENINGS IN CORNERS, DISPLAY DEVICE INCLUDING THE DISPLAY PANEL AND ELECTRONIC DEVICE INCLUDING THE DISPLAY DEVICE

This application claims priority to Korean Patent Application No. 10-2021-0100685, filed on Jul. 30, 2021, and all the benefits accruing therefrom under 35 U.S.C. § 119, the content of which in its entirety is herein incorporated by reference.

BACKGROUND

1. Field

Embodiments of the invention relate to a display panel and a display device.

2. Description of the Related Art

Mobile electronic devices are being widely used. As the mobile electronic devices, tablet personal computers are being widely used in recent days in addition to small electronic devices such as mobile phones.

The mobile electronic device includes a display device to provide a user with various functions, for example, visual information such as still images or moving images. Recently, as sizes of components for driving the mobile electronic devices are reduced, an importance of the display devices in electronic devices tends to increase, and a structure that may be bent to have a predetermined angle in a flat state is being developed.

SUMMARY

A display device may include a display panel and a cover window for protecting the display panel, and the cover window may be aligned on the display panel and then attached thereto. In this case, the display panel and the cover window may include a first alignment mark and a second alignment mark, respectively.

Embodiments of the invention provide a display panel that displays an image even in a corner area of the display panel and includes a first alignment mark corresponding to a second alignment mark of a cover window, and a display device.

Additional features will be set forth in part in the description which follows and, in part, will be apparent from the description, or may be learned by practice of the presented embodiments of the invention.

In an embodiment of the invention, a display panel includes a substrate including a central area and a corner area on an outer side of the central area, a plurality of pixels arranged on the substrate and including a first pixel, a second pixel, a third pixel, and a fourth pixel that overlap the corner area, and a first inorganic layer defining a first opening, which is arranged between the first pixel and the second pixel, and a second opening, which is arranged between the third pixel and the fourth pixel, where a shape of the first opening is different from a shape of the second opening.

In an embodiment, a planar area of the first opening may be greater than a planar area of the second opening.

In an embodiment, the display panel may further include a metal pattern overlapping the first opening.

In an embodiment, the display panel may further include an organic insulating layer arranged between the substrate and the first inorganic layer and defining a hole overlapping the first opening, and a display element layer arranged on the first inorganic layer and including a plurality of display elements of the plurality of pixels.

In an embodiment, the display panel may further include a second inorganic layer arranged between the substrate and the organic insulating layer, and a wire arranged between the substrate and the second inorganic layer, where the second inorganic layer overlaps the hole.

In an embodiment, the first inorganic layer may include a protruding tip protruding towards the center of the hole.

In an embodiment, the display panel may further include an encapsulation layer arranged on the display element layer and including an inorganic encapsulation layer and an organic encapsulation layer, where the inorganic encapsulation layer may directly contact the protruding tip.

In an embodiment, the corner area may include a plurality of extension areas respectively extending in a direction away from the central area, and a separation area may be defined between adjacent extension areas of the plurality of extension areas.

In an embodiment, the plurality of pixels may be arranged along a plurality of lines in the plurality of extension areas, and the first opening may extend to cross the plurality of lines.

In an embodiment, the substrate may further include a first area, which extends from the central area in a first direction, and a second area, which extends from the central area in a second direction crossing the first direction, and the corner area may surround at least a part of the first area, the central area, and the second area.

In another embodiment of the invention, a display device includes a display panel, and a cover window arranged on the display panel, where the display panel includes a substrate including a central area and a corner area that is bent on an outer side of the central area, a plurality of pixels arranged on the substrate and including a first pixel, a second pixel, a third pixel, and a fourth pixel that overlap the corner area, and an inorganic layer defining a first opening, which is arranged between the first pixel and the second pixel, and a second opening, which is arranged between the third pixel and the fourth pixel, where a shape of the first opening is different from a shape of the second opening.

In an embodiment, a planar area of the first opening may be greater than a planar area of the second opening.

In an embodiment, the display panel may further include a metal pattern overlapping the first opening.

In an embodiment, the first opening may be a first alignment mark, and the cover window may include a second alignment mark.

In an embodiment, the display panel may further include an organic insulating layer arranged between the substrate and the inorganic layer and including a hole overlapping the first opening, and a display element layer arranged on the inorganic layer and including a plurality of display elements of the plurality of pixels.

In an embodiment, the inorganic layer may include a protruding tip protruding towards the center of the hole.

In an embodiment, the display panel may further include an encapsulation layer arranged on the display element layer and including an inorganic encapsulation layer and an organic encapsulation layer, where the inorganic encapsulation layer may directly contact the protruding tip.

In an embodiment, the corner area may include a plurality of extension areas respectively extending in a direction away from the central area, and a separation area may be defined between adjacent extension areas of the plurality of extension areas.

In an embodiment, the plurality of pixels may be arranged along a plurality of lines in the plurality of extension areas, and the first opening may extend to cross the plurality of lines.

In an embodiment, the substrate may further include a first area that is adjacent to the central area and bent in a first direction, and a second area that is adjacent to the central area and bent in a second direction crossing the first direction, where the corner area may surround at least a part of the first area, the central area, and the second area.

BRIEF DESCRIPTION OF THE DRAWINGS

The above and other embodiments, features, and advantages of the invention will be more apparent from the following description taken in conjunction with the accompanying drawings, in which.

DETAILED DESCRIPTION

Figure 1:
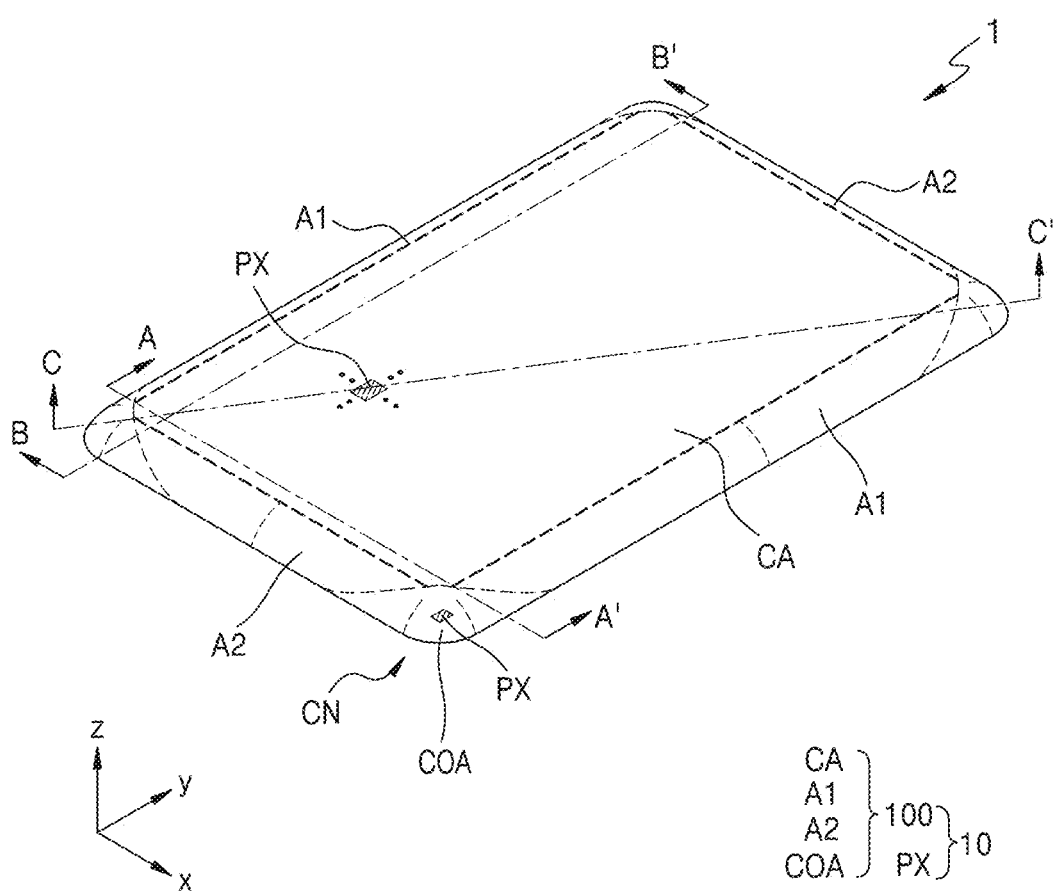
FIG. 1 is a perspective view of an embodiment of a display device.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the invention allows for various changes and numerous embodiments, particular embodiments will be illustrated in the drawings and described in detail in the written description. Effects, features, and methods for achieving them will become apparent from the embodiments described below in detail with reference to the accompanying drawings. The disclosure may be embodied in many different forms and should not be construed as being limited to the embodiments set forth herein.

Embodiments of the invention will be described in detail in the written description with reference to the attached drawings. Like reference numerals in the drawings denote like elements, and thus their description will be omitted.

While such terms as "first," "second," etc., may be used to describe various components, such components must not be limited to the above terms. These terms are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "disposed on" another layer, region, or component, it can be directly or indirectly disposed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. Two consecutively described processes may be performed substantially at the same time or performed in an order opposite to the described order, for example.

It will be understood that when a layer, region, or component is referred to as being "connected to" another layer, region, or component, it can be directly or indirectly connected to the other layer, region, or component. That is, for example, intervening layers, regions, or components may be present. It will be understood that when a layer, region, or component is referred to as being "electrically connected to" another layer, region, or component, it can be electrically connected directly or indirectly to the other layer, region, or component. That is, for example, intervening layers, regions, or components may be present.

A display device displays a moving image or a still image and may be used as a display screen of various products, for example, a portable electronic device such as a mobile phone, a smartphone, a tablet personal computer, a mobile communication terminal, an electronic notebook, an e-book terminal, a portable multimedia player ("PMP"), or a navigation device, a television, a laptop, a monitor, a billboard, and an internet of things ("IoT") device. Also, a display device may be used in a wearable device such as a smartwatch, a watch phone, smart glasses, and a head-mounted display ("HMD"). Also, a display device may be used in an instrument cluster of a vehicle, a center information display ("CID") disposed (e.g., mounted) on a center fascia or a dashboard of a vehicle, a room mirror display replacing a side-view mirror of a vehicle, or a car headrest monitor provided for rear seat entertainment.

Figure 2A:
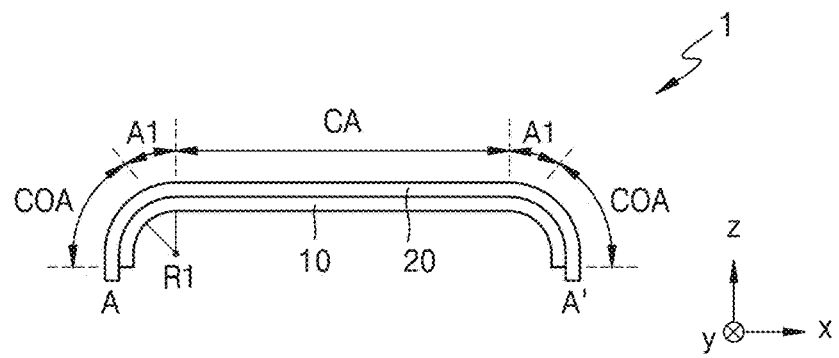
FIG. 2A is a cross-sectional view of the display device of FIG. 1, taken along line A-A'.
Figure 2B:
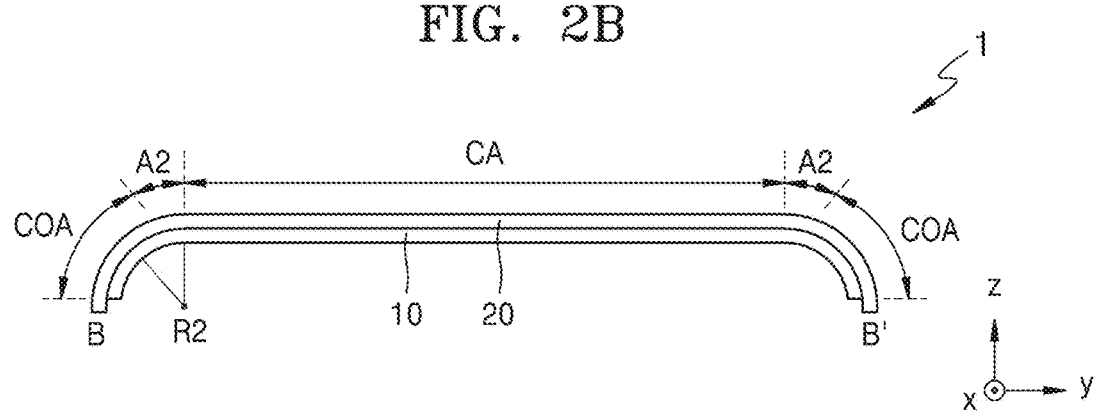
FIG. 2B is a cross-sectional view of the display device of FIG. 1, taken along line B-B'.
Figure 2C:
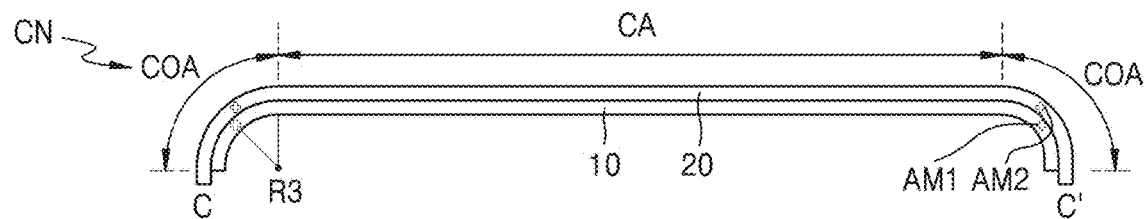
FIG. 2C is a cross-sectional view of the display device of FIG. 1, taken along line C-C'.

FIG. 1 is a perspective view of an embodiment of a display device 1. FIG. 2A is a cross-sectional view of the display device 1 of FIG. 1, taken along line A-A'. FIG. 2B is a cross-sectional view of the display device 1 of FIG. 1, taken along line B-B'. FIG. 2C is a cross-sectional view of the display device 1 of FIG. 1, taken along line C-C'.

Referring to FIGS. 1 to 2C, the display device 1 may display an image. The display device 1 may have an edge in a first direction and an edge in a second direction. Here, the first direction and the second direction may cross each other. In an embodiment, the first and second directions may be at an acute angle to each other. In another embodiment, the first and second directions may be at an obtuse angle to each other or may cross at right angles. Hereinafter, a case where the first and second directions cross at right angles will be described in detail. In an embodiment, the first direction may be an x direction or a −x direction, and the second direction may be a y direction or a −y direction, for example.

In an embodiment, a corner CN, in which the edge in the first direction (e.g., the x direction or the −x direction) meets the edge in the second direction (e.g., the y direction or the −y direction), may have a predetermined curvature.

The display device 1 may include a display panel 10 and a cover window 20. The cover window 20 may protect the display panel 10. The cover window 20 may be arranged on the display panel 10. In an embodiment, the cover window 20 may be a flexible window. The cover window 20 may be flexibly curved according to an external force without the generation of cracks and may protect the display panel 10. The cover window 20 may include ultra-thin glass or colorless polyimide. In an embodiment, the cover window 20 may have a structure in which a flexible polymer layer is arranged on a surface of a glass substrate, or a structure including only polymer layers.

The display panel 10 may be arranged under the cover window 20. The display panel 10 may be attached to the cover window 20 by a clear adhesive such as an optically clear adhesive film.

The display panel 10 may display an image. The display panel 10 may include a substrate 100 and a pixel PX. The substrate 100 may include a central area CA, a first area A1, a second area A2, and a corner area COA. In an embodiment, a shape of the substrate 100 may define a shape of the display device 1.

The central area CA may be planar. In an embodiment, most images may be provided in the central area CA of the display device 1.

The first area A1 may be adjacent to the central area CA and bent in the first direction (e.g., the x direction or the −x direction). The first area A1 may be defined as an area that is bent from the central area CA in the cross-section of the display device 1 (e.g., an xz cross-section) in the first direction (e.g., the x direction or the −x direction). The first area A1 may extend in the second direction (e.g., the y direction or the −y direction). In other words, the first area A1 may not be bent in a cross-section of the display device 1 (e.g., a yz cross-section) in the second direction (e.g., the y direction or the −y direction). FIG. 2A illustrates that the first area A1, which extends from the central area CA in the x direction and is bent, has the same curvature as that of the first area A1, which extends from the central area CA in the −x direction and is bent. In another embodiment, however, the first area A1, which extends from the central area CA in the x direction and is bent, may have a different curvature from that of the first area A1, which extends from the central area CA in the −x direction and is bent.

The second area A2 may be adjacent to the central area CA and bent in the second direction (e.g., the y direction or the −y direction). The second area A2 may be defined as an area that is bent from the central area CA in a cross-section of the display device 1 (e.g., the yz cross-section) in the second direction (e.g., they direction or the −y direction). The second area A2 may extend in the first direction (e.g., the x direction or the −x direction). The second area A2 may not be bent in the cross-section of the display device 1 (e.g., the xz cross-section) in the first direction (e.g., the x direction or the −x direction). FIG. 2B illustrates that the second area A2, which extends from the central area CA in the y direction and is bent, has the same curvature as that of the second area A2, which extends from the central area CA in the −y direction and is bent. In another embodiment, however, the second area A2, which extends from the central area CA in the y direction and is bent, may have a different curvature from that of the second area A2, which extends from the central area CA in the −y direction and is bent.

The corner area COA may be an area arranged in the corner CN. In an embodiment, the corner area COA may be an area where the edge in the first direction (e.g., the x direction or the −x direction) meets the edge in the second direction (e.g., the y direction or the −y direction). In an embodiment, the corner area COA may surround at least a part of the central area CA, the first area A1, and the second area A2. When the first area A1 extends in the first direction (e.g., the x direction or the −x direction) and is bent, and when the second area A2 extends in the second direction (e.g., the y direction or the −y direction) and is bent, at least a portion of the corner area COA may extend in the first direction (e.g., the x direction or the −x direction) and be bent and may extend in the second direction (e.g., the y direction or the −y direction) and be bent. In other words, at least a portion of the corner area COA may be a multiple-curve area where multiple curvatures overlap each other in predetermined directions. In an embodiment, the corner area COA may be provided in plural.

Referring to FIG. 2A, the first area A1 and some portions of the corner area COA may have a first radius of curvature R1 and may be bent. Referring to FIG. 2B, the second area A2 and other portions of the corner area COA may have a second radius of curvature R2 and may be bent. Referring to FIG. 2C, the other portions of the corner area COA may have a third radius of curvature R3 and may be bent.

The pixel PX may be arranged on the substrate 100. In an embodiment, the pixel PX may be provided in plural, and a plurality of pixels PX may emit light. Therefore, the display panel 10 may display an image. In an embodiment, the plurality of pixels PX may each include a red sub-pixel, a green sub-pixel, and a blue sub-pixel. In an alternative embodiment, the plurality of pixels PX may each include a red sub-pixel, a green sub-pixel, a blue sub-pixel, and a white sub-pixel.

The pixel PX may be arranged in at least one of the central area CA, the first area A1, the second area A2, and the corner area COA. Therefore, the display device 1 may display an image in the central area CA, the first area A1, the second area A2, and the corner area COA. In an embodiment, the display device 1 may individually provide an image in the central area CA, the first area A1, the second area A2, and the corner area COA. In another embodiment, the display device 1 may provide portions of any image in each of the central area CA, the first area A1, the second area A2, and the corner area COA.

A plurality of pixels PX may be arranged in the central area CA as well as the first area A1, the second area A2, and the corner area COA, and thus, the image may be displayed in the display device 1. Therefore, an area of the display device 1, where the image is displayed, may increase. Also, the display device 1 may be bent in the corner CN and display the image, and thus, an aesthetic sense may be improved.

The display panel 10 may include a first alignment mark AM1, and the cover window 20 may include a second alignment mark AM2. In an embodiment, the first alignment mark AM1 and the second alignment mark AM2 may correspond to each other. The first alignment mark AM1 and the second alignment mark AM2 may be used to align the display panel 10 with the cover window 20 before the display panel 10 is attached to the cover window 20. In an embodiment, the first alignment mark AM1 may be arranged in the corner area COA of the display panel 10. The corner area COA may be an area where an image is displayed as well as an area where the first alignment mark AM1 is arranged. In this case, the first alignment mark AM1 may be arranged between adjacent pixels PX in the corner area COA.

Figure 3:
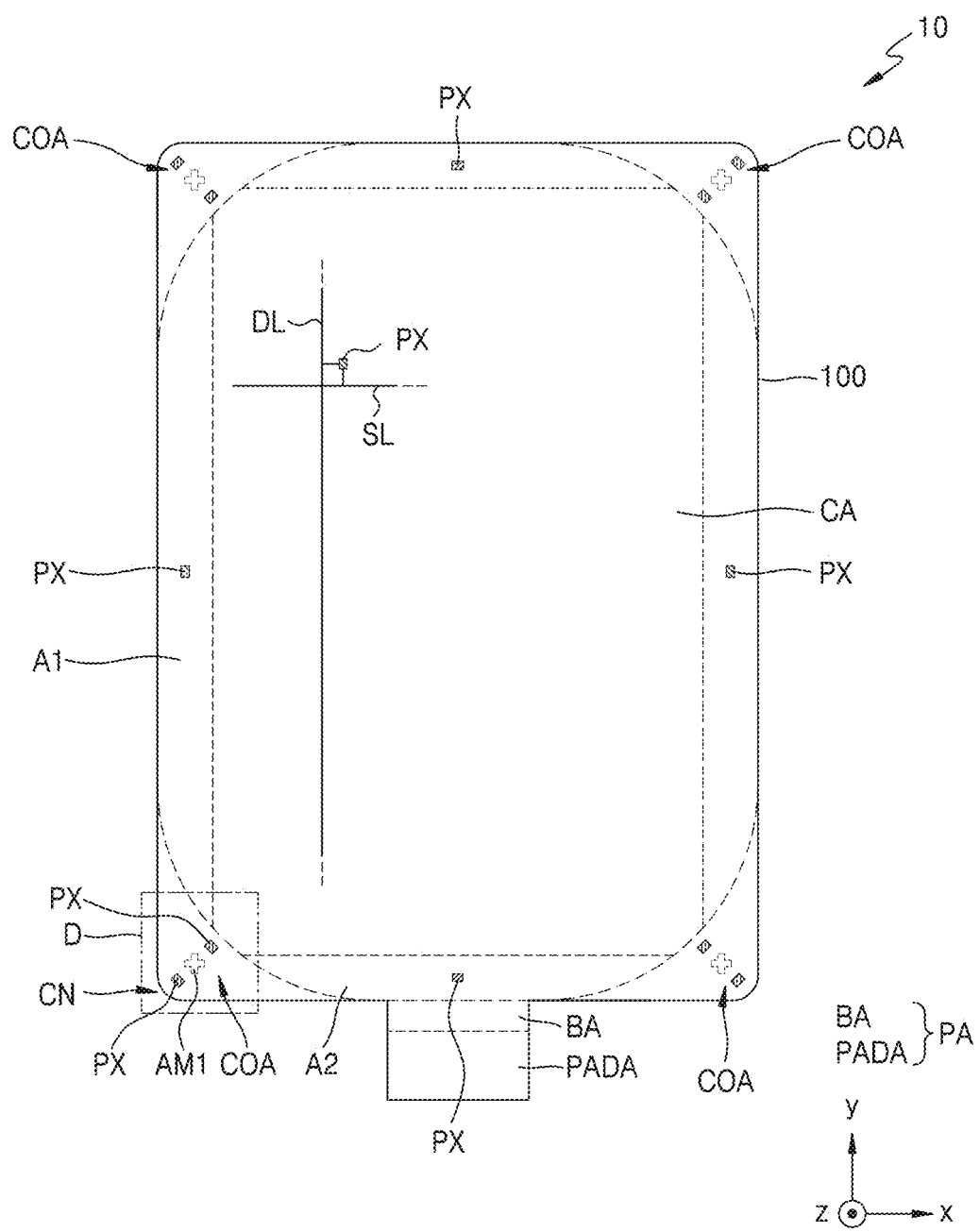
FIG. 3 is a plan view of an embodiment of a display panel.

FIG. 3 is a plan view of an embodiment of the display panel 10. FIG. 3 illustrates an unbent state of the display panel 10.

Referring to FIG. 3, an image may be displayed on the display panel 10. The display panel 10 may include the substrate 100, the pixel PX, and the first alignment mark AM1. The substrate 100 may include the central area CA, the first area A1, the second area A2, the corner area COA, and a peripheral area PA. The central area CA may be planar or flat. In an embodiment, the image may be mostly provided in the central area CA of the display panel 10.

The first area A1 may be adjacent to the central area CA in the first direction (e.g., the x direction or the −x direction). In an embodiment, the first area A1 may extend from the central area CA in the first direction (e.g., the x direction or the −x direction). In an embodiment, the first area A1 may be provided in plural, and the central area CA may be arranged between a plurality of first areas A1.

The second area A2 may be adjacent to the central area CA in the second direction (e.g., the y direction or −y direction). In an embodiment, the second area A2 may extend from the central area CA in the second direction (e.g., the y direction or −y direction). In an embodiment, the second area A2 may be provided in plural, and the central area CA may be arranged between a plurality of second areas A2.

The corner area COA may be arranged in the corner CN of the display panel 10. In an embodiment, the corner area COA may be arranged on an outer side of the central area CA. In an embodiment, the corner area COA may be an area where the edge of the display panel 10 in the first direction (e.g., the x direction or the −x direction) meets the edge of the display panel 10 in the second direction (e.g., they direction or −y direction). In an embodiment, the corner area COA may surround at least a part of the central area CA, the first area A1, and the second area A2.

The peripheral area PA may be arranged on an outer side of at least one of the first area A1 and the second area A2. In an embodiment, the peripheral area PA may be arranged on an outer side of any one of the second areas A2. In the peripheral area PA, the pixel PX may not be arranged. Therefore, the peripheral area PA may be a non-display area where images are not displayed. In the peripheral area PA, a driving circuit for providing an electrical signal and/or a power line for supplying power may be arranged. In an embodiment, the peripheral area PA may include a bending area BA and a pad area PADA.

The bending area BA may be arranged between the pad area PADA and the second area A2. In the bending area BA, the display panel 10 may be bent. In this case, when the display panel 10 is bent, the pad area PADA may face a rear surface of the display panel 10 that is opposite to a front surface of the display panel 10 on which an image is displayed. Therefore, an area of the peripheral area PA visible by a user may decrease.

The pad area PADA may be arranged on an outer side of the bending area BA. In the pad area PADA, a pad (not illustrated) may be arranged. The display panel 10 may be connected to a circuit board through the pad. Therefore, the display panel 10 may receive, from the circuit board, an electrical signal and/or a power voltage.

At least one of the first area A1, the second area A2, and the corner area COA may be bent. In an embodiment, the first area A1 and some portions of the corner area COA may be bent in a cross-section (e.g., an xz cross-section) in the first direction (e.g., the x direction or −x direction), for example. The second area A2 and other portions of the corner area COA may be bent in a cross-section (e.g., an yz cross-section) in the second direction (e.g., the y direction or the −y direction). Other portions of the corner area COA may be bent in the cross-section (e.g., the xz cross-section) in the first direction (e.g., the x direction or −x direction) and in the cross-section (e.g., the yz cross-section) in the second direction (e.g., the y direction or the −y direction).

When the corner area COA is bent, compressive strain may be greater than tensile strain in the corner area COA. In this case, the display panel 10 needs to be contractible in at least some portions of the corner area COA. In an embodiment, a structure of the display panel 10 in the corner area COA may be different from a structure of the display panel 10 in the central area CA.

The pixel PX and the first alignment mark AM1 may be arranged on the substrate 100. The pixel PX may be arranged in at least one of the central area CA, the first area A1, the second area A2, and the corner area COA. The pixel PX may be provided in plural. A plurality of pixels PX may be arranged in the central area CA, the first area A1, the second area A2, and the corner area COA.

The pixel PX may include a display element. In an embodiment, the plurality of pixels PX may respectively include a plurality of display elements. In an embodiment, the display element may be an organic light-emitting diode ("organic LED") including an organic emission layer. In an alternative embodiment, the display element may be an LED. A size of the LED may be a micro-scale or a nano-scale. In an embodiment, the LED may be a micro-LED. In an alternative embodiment, the LED may be a nanorod LED. In an embodiment, the nanorod LED may include gallium nitride (GaN), for example. In an embodiment, a color conversion layer may be arranged on the nanorod LED. The color conversion layer may include quantum dots. In an alternative embodiment, the display element may be a quantum dot LED ("QLED") including a quantum dot emission layer. In an alternative embodiment, the display element may be an inorganic LED including an inorganic semiconductor.

The pixel PX may include a plurality of sub-pixels, and each sub-pixel may emit a predetermined color of light by the display element. In the specification, the sub-pixel may be a minimum unit for realizing an image and denote an emission area. When an organic LED is used as a display element, the emission area may be defined by an opening of a pixel-defining layer. It will be described below.

The pixel PX may receive a scan signal through a scan line SL. In an embodiment, the scan line SL may extend in the first direction (e.g., the x direction or the −x direction).

The pixel PX may receive a data signal through a data line DL. In an embodiment, the data line DL may extend in the second direction (e.g., the y direction or the −y direction).

The first alignment mark AM1 may be arranged in the corner area COA. In an embodiment, the first alignment mark AM1 may be provided in plural. In an embodiment, a plurality of first alignment marks AM1 may be arranged in the corner areas COA, respectively. FIG. 3 illustrates that one first alignment mark AM1 is arranged in one corner area COA, but in another embodiment, the plurality of first alignment marks AM1 may be arranged in one corner area COA.

The first alignment mark AM1 may be arranged between adjacent pixels PX in the corner area COA. Therefore, the corner area COA may be an area where an image is displayed and also be an area where the first alignment mark AM1 is arranged.

Figure 4:
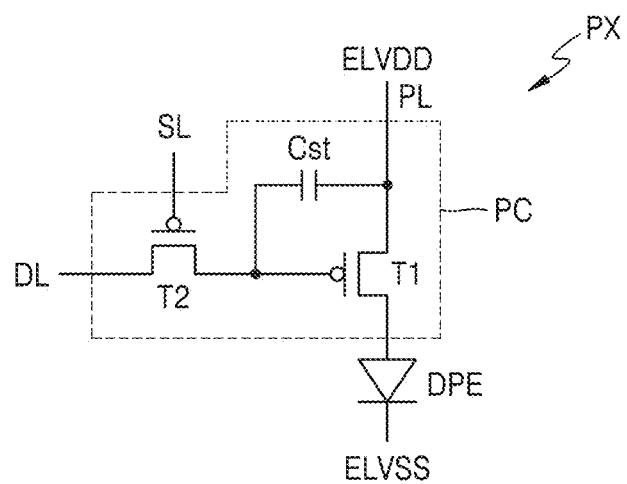
FIG. 4 is an equivalent circuit diagram of a pixel that may be applied to a display panel.

FIG. 4 is an equivalent circuit diagram of a pixel PX that may be applied to a display panel.

Referring to FIG. 4, the pixel PX may include a pixel circuit PC and a display element DPE. The pixel circuit PC may be electrically connected to the display element DPE. The pixel circuit PC may include a driving thin film transistor T1, a switching thin film transistor T2, and a storage capacitor Cst. In an embodiment, the display element DPE may emit red, green, or blue light or may emit red, green, blue, or white light.

The switching thin film transistor T2 may be connected to the scan line SL and the data line DL and may transmit a data signal or a data voltage, which is input from the data line DL, to the driving thin film transistor T1 according to a scan signal or a switching voltage that is input from the scan line SL.

The storage capacitor Cst may be connected to the switching thin film transistor T2 and a driving voltage line PL and may store a voltage corresponding to a difference between a voltage from the switching thin film transistor T2 and a first power voltage ELVDD provided to the driving voltage line PL.

The driving thin film transistor T1 may be connected to the driving voltage line PL and the storage capacitor Cst and may control a driving current flowing from the driving voltage line PL towards the display element DPE according to the voltage stored in the storage capacitor Cst. The display element DPE may emit light having a predetermined brightness, according to the driving current. An opposite electrode of the display element DPE may receive a second power voltage ELVSS.

FIG. 4 illustrates that the pixel circuit PC includes two thin film transistors and one storage capacitor, but the pixel circuit PC may include more thin film transistors.

Figure 5:
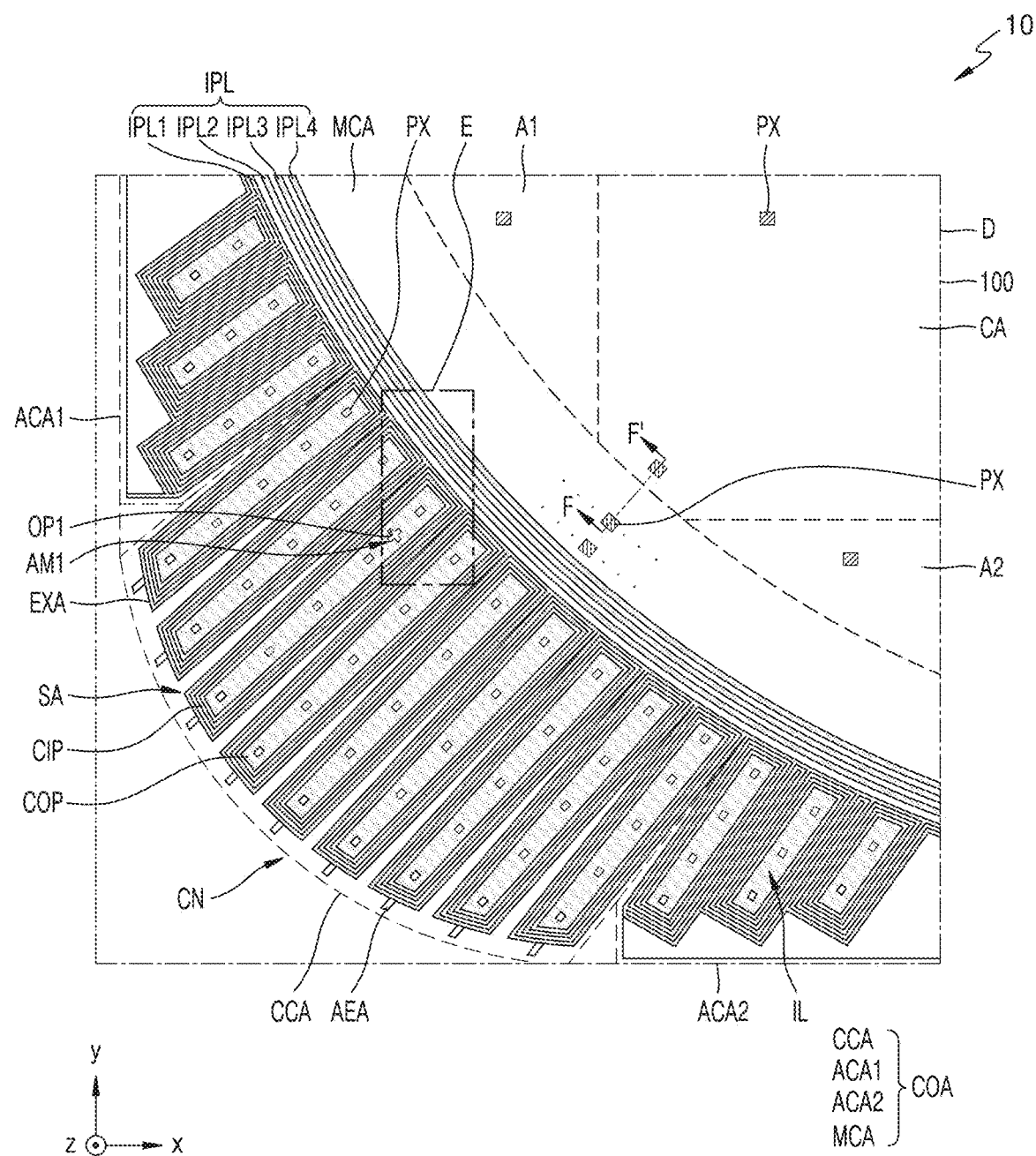
FIG. 5 is an enlarged diagram illustrating a region D of the display panel of FIG. 3.
Figure 6:
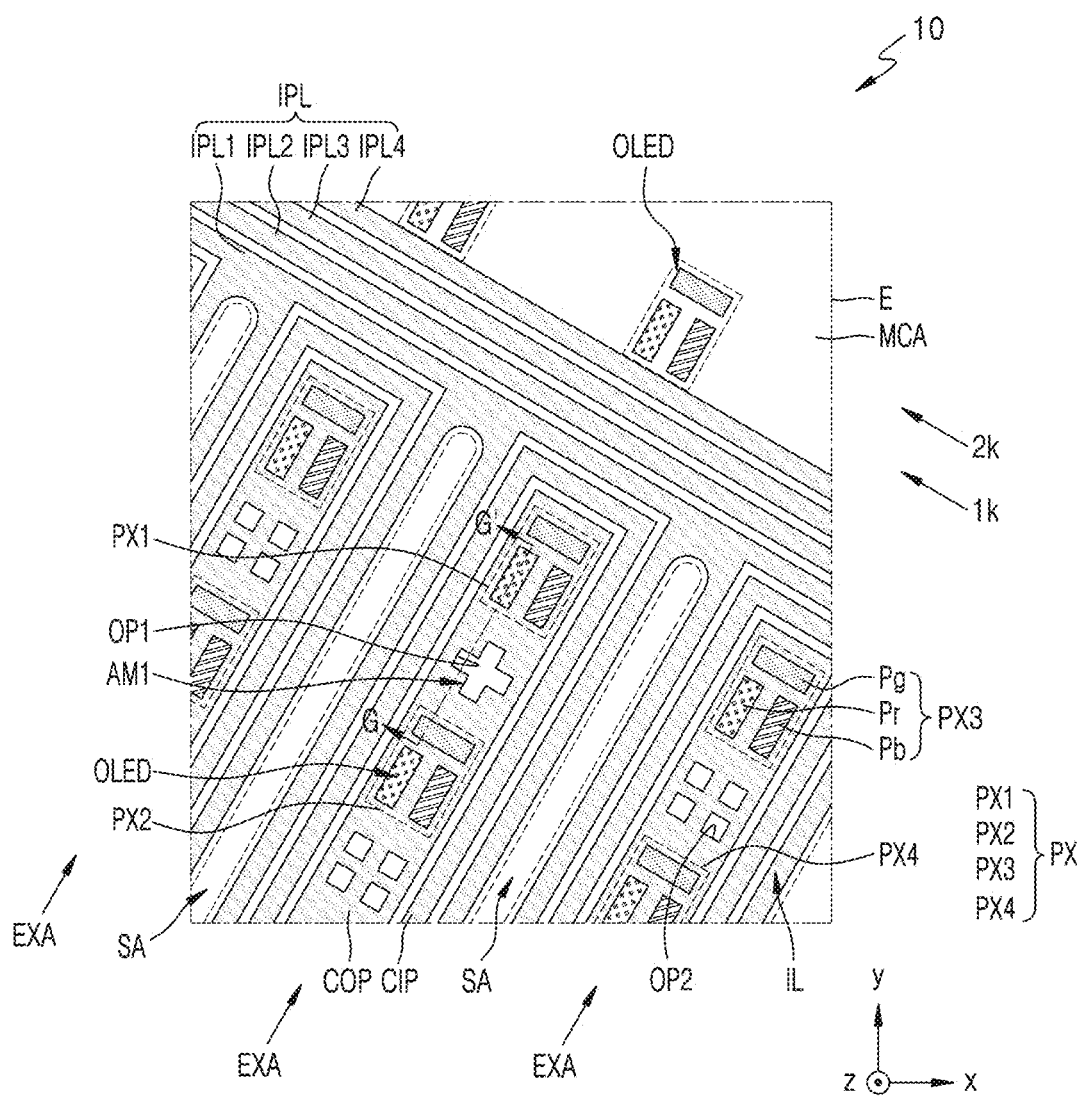
FIG. 6 is an enlarged diagram illustrating a region E of the display panel of FIG. 5.

FIG. 5 is an enlarged diagram illustrating a region D of the display panel 10 of FIG. 3. FIG. 6 is an enlarged diagram illustrating a region E of the display panel 10 of FIG. 5.

Referring to FIGS. 5 and 6, the display panel 10 may include the substrate 100, the pixel PX, and an inorganic layer IL. The pixel PX and the inorganic layer IL may be arranged on the substrate 100. The substrate 100 may include the central area CA, the first area A1, the second area A2, and the corner area COA.

The first area A1 may be adjacent to the central area CA in the first direction (e.g., the x direction or the −x direction). The first area A1 may extend from the central area CA in the first direction (e.g., the x direction or the −x direction). The second area A2 may be adjacent to the central area CA in the second direction (e.g., the y direction or the −y direction). The second area A2 may extend from the central area CA in the second direction (e.g., the y direction or the −y direction).

The corner area COA may be arranged in the corner CN of the display panel 10. In an embodiment, the corner area COA may be an area where the edge of the display panel 10 in the first direction (e.g., the x direction or the −x direction) meets the edge of the display panel 10 in the second direction (e.g., the y direction or the −y direction). In an embodiment, the corner area COA may surround at least a part of the central area CA, the first area A1, and the second area A2. The corner area COA may include a central corner area CCA, a first adjacent corner area ACA1, a second adjacent corner area ACA2, and a middle corner area MCA.

The central corner area CCA may include a plurality of extension areas EXA. The plurality of extension areas EXA may respectively extend in a direction away from the central area CA. In an embodiment, the plurality of extension areas EXA may extend in a direction crossing the first direction (e.g., the x direction or the −x direction) and the second direction (e.g., the y direction or the −y direction). Separation area SA may be defined between adjacent extension areas EXA. The separation area SA may be an area where components of the display panel 10 are not arranged. When the central corner area CCA is bent in the corner CN, compressive strain may be greater than tensile strain in the central corner area CCA. In the illustrated embodiment, the central corner area CCA may contract because the separation area SA is defined between adjacent extension areas EXA. Therefore, the display panel 10 may be bent in the central corner area CCA without any damage. In an embodiment, the extension areas EXA may respectively include auxiliary extension areas AEA in end portions thereof.

The first adjacent corner area ACA1 may be adjacent to the central corner area CCA. In an embodiment, at least a portion of the first area A1 and the first adjacent corner area ACA1 may be arranged in the first direction (e.g., the x direction or the −x direction). An end portion of the central corner area CCA may be spaced apart from that of the first adjacent corner area ACA1. The separation area SA may not be defined inside the first adjacent corner area ACA1.

The second adjacent corner area ACA2 may be adjacent to the central corner area CCA. At least a portion of the second area A2 may be arranged between the central area CA and the second adjacent corner area ACA2 in the second direction (e.g., the y direction or the −y direction). An end portion of the central corner area CCA may be spaced apart from that of the second adjacent corner area ACA2. The separation area SA may not be defined inside the second adjacent corner area ACA2.

The middle corner area MCA may be arranged between the central area CA and the central corner area CCA. The middle corner area MCA may extend between the central area CA and the first adjacent corner area ACA1. The middle corner area MCA may extend between the central area CA and the second adjacent corner area ACA2. In an embodiment, the middle corner area MCA may surround at least a part of the central area CA. In an embodiment, a driving circuit may be arranged in the middle corner area MCA.

The plurality of pixels PX may be arranged in the central area CA, the first area A1, the second area A2, and the corner area COA. Therefore, the display panel 10 may display images in the central area CA, the first area A1, the second area A2, and the corner area COA. In an embodiment, the plurality of pixels PX may be arranged in the central area CA, the first area A1, the second area A2, and the corner area COA. In an embodiment, the plurality of pixels PX may be arranged in an extension direction of the plurality of extension areas EXA. The plurality of pixels PX may respectively include a plurality of display elements. The display element may be, for example, an organic LED OLED.

In an embodiment, the pixel PX may include a red sub-pixel Pr, a green sub-pixel Pg, and a blue sub-pixel Pb. The red sub-pixel Pr, the green sub-pixel Pg, and the blue sub-pixel Pb may emit red light, green light, and blue light, respectively.

The red sub-pixel Pr, the green sub-pixel Pg, and the blue sub-pixel Pb may be arranged in the form of S-stripe. The red sub-pixel Pr and the blue sub-pixel Pb may be arranged in a first column $1k$, and the green sub-pixel Pg may be arranged in an adjacent second column $2k$. In an embodiment, a side of the green sub-pixel Pg may face a side of the red sub-pixel Pr and a side of the blue sub-pixel Pb. In an alternative embodiment, unlike the illustration, the red sub-pixel Pr, the green sub-pixel Pg, and the blue sub-pixel Pb may be arranged side by side or in the form of PenTile™.

In an embodiment, the plurality of pixels PX may include a first pixel PX1, a second pixel PX2, a third pixel PX3, and a fourth pixel PX4. The first pixel PX1, the second pixel PX2, the third pixel PX3, and the fourth pixel PX4 may overlap the corner area COA. In an embodiment, the first pixel PX1, the second pixel PX2, the third pixel PX3, and the fourth pixel PX4 may be arranged in the plurality of extension areas EXA. In an embodiment, the first pixel PX1 and the second pixel PX2 may be adjacent to each other in one extension area EXA. The third pixel PX3 and the fourth pixel PX4 may be adjacent to each other in one extension area EXA.

The inorganic layer IL may overlap the corner area COA. In an embodiment, the inorganic layer IL may not overlap the central area CA, the first area A1, and the second area A2. The inorganic layer IL may include an overlapping inorganic pattern COP, a corner inorganic pattern CIP, and inorganic pattern line IPL.

The overlapping inorganic pattern COP and the corner inorganic pattern CIP may overlap the plurality of extension areas EXA. In an embodiment, the overlapping inorganic pattern COP may be provided in plural. A plurality of overlapping inorganic patterns COP may overlap the plurality of extension areas EXA, respectively. The overlapping inorganic patterns COP may extend in the extension direction of the extension areas EXA.

The corner inorganic pattern CIP may surround the overlapping inorganic patterns COP. The corner inorganic pattern CIP may be provided in plural. The plurality of corner inorganic patterns CIP may respectively surround the plurality of overlapping inorganic patterns COP.

The inorganic pattern line IPL may surround at least a portion of the central area CA. In an embodiment, the inorganic pattern line IPL may surround at least a part of the central area CA, the first area A1, and the second area A2. In an embodiment, the inorganic pattern line IPL may include a first inorganic pattern line IPL1, a second inorganic pattern line IPL2, a third inorganic pattern line IPL3, and a fourth inorganic pattern line IPL4.

The first inorganic pattern line IPL1 may surround the plurality of extension areas EXA. In an embodiment, a portion of the first inorganic pattern line IPL1 may extend in a direction away from the central area CA. The first inorganic pattern line IPL1 may surround the overlapping inorganic pattern COP and the corner inorganic pattern CIP. In an embodiment, the first inorganic pattern line IPL1 may surround the plurality of overlapping inorganic patterns COP and the plurality of corner inorganic patterns CIP. In this case, the corner inorganic patterns CIP may be arranged between the overlapping inorganic pattern COP and the first inorganic pattern line IPL1.

The second inorganic pattern line IPL2 may be adjacent to the first inorganic pattern line IPL1. The first inorganic pattern line IPL1 may surround at least a portion of the second inorganic pattern line IPL2. The first inorganic pattern line IPL1 may be arranged between the second inorganic pattern line IPL2 and the corner inorganic pattern CIP.

The third inorganic pattern line IPL3 may be adjacent to the second inorganic pattern line IPL2. The second inorganic pattern line IPL2 may surround at least a portion of the third inorganic pattern line IPL3. The second inorganic pattern line IPL2 may be arranged between the first inorganic pattern line IPL1 and the third inorganic pattern line IPL3.

The fourth inorganic pattern line IPL4 may be adjacent to the third inorganic pattern line IPL3. The third inorganic pattern line IPL3 may surround at least a portion of the fourth inorganic pattern line IPL4. The third inorganic pattern line IPL3 may be arranged between the second inorganic pattern line IPL2 and the fourth inorganic pattern line IPL4.

A first opening OP1 arranged between the first pixel PX1 and the second pixel PX2 and a second opening OP2 arranged between the third pixel PX3 and the fourth pixel PX4 may be defined in the inorganic layer IL. In an embodiment, the first pixel PX1 and the second pixel PX2 may overlap the overlapping inorganic pattern COP, and the first opening OP1 may be defined in the overlapping inorganic pattern COP. In an embodiment, the third pixel PX3 and the fourth pixel PX4 may overlap the overlapping inorganic pattern COP, and the second opening OP2 may be defined in the overlapping inorganic pattern COP. The first opening OP1 and the second opening OP2 may not overlap the organic LED OLED as a display element. The first opening OP1 and the second opening OP2 may become passages through which gas generated from a layer including an organic material is discharged, where the layer is arranged under the inorganic layer IL. Therefore, the reliability of the display panel 10 may be improved.

At least one first opening OP1 may be defined in the corner area COA. In an embodiment, one first opening OP1 may be defined in the corner area COA, for example. In another embodiment, the first openings OP1 may be spaced apart from each other in the corner area COA. The second opening OP2 may be provided in plural. In an embodiment, a plurality of second openings OP2 may be arranged between the third pixel PX3 and the fourth pixel PX4. In an embodiment, four second openings OP2 may be arranged between the third pixel PX3 and the fourth pixel PX4, for example.

A shape of the first opening OP1 may be different from that of the second opening OP2. In an embodiment, the shape of the first opening OP1 may be a cross, and the shape of the second opening OP2 may be a quadrangle (e.g., rectangle), for example. The first opening OP1 may be the first alignment mark AM1. In an alternative embodiment, the first opening OP1 may function as the first alignment mark AM1. Unlike the illustrated embodiment, when the shape of the first opening OP1 is the same as that of the second opening OP2, the first opening OP1 may not function as the first alignment mark AM1. Also, because the plurality of pixels PX is arranged in the corner area COA, there would not be a sufficient area for a separate alignment mark. In the illustrated embodiment, because the first opening OP1, which has a different shape from that of the second opening OP2, may be used, it is not desired to secure an additional area for an alignment mark.

A planar area of the first opening OP1 may be greater than that of the second opening OP2. In an embodiment, one first opening OP1 may be arranged between the first pixel PX1 and the second pixel PX2, and the plurality of second openings OP2 may be arranged between the third pixel PX3 and the fourth pixel PX4, for example. When the planar area of the first opening OP1 is less than that of the second opening OP2, the first opening OP1 may not function as the first alignment mark AM1. In the illustrated embodiment, because the planar area of the first opening OP1 is greater than that of the second opening OP2, the first opening OP1 may be recognized as the first alignment mark AM1.

FIGS. 7A to 7G are plan views illustrating a shape of the first opening OP1, according to various embodiments.

Referring to FIGS. 7A to 7G, the shape of the first opening OP1 included in the inorganic layer IL may be different from the shape of the second opening OP2 included in the inorganic layer IL.

Figure 7A:
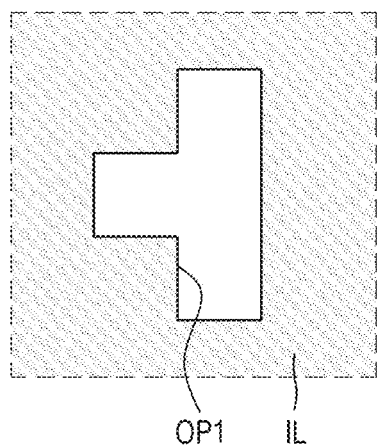
FIGS. 7A to 7G are plan views illustrating a shape of a first opening, according to various embodiments.

Referring to FIG. 7A, the shape of the first opening OP1 may be an English capital 'T.'

Figure 7B:
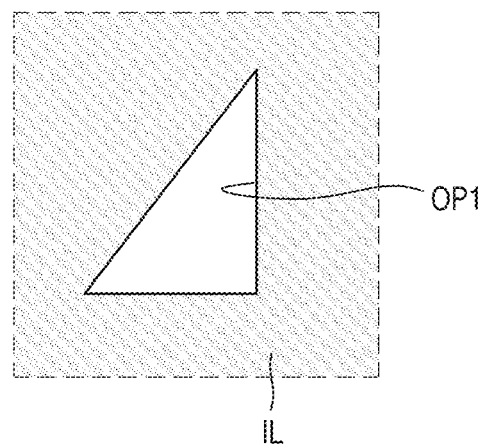

Referring to FIG. 7B, the shape of the first opening OP1 may be a triangle.

Figure 7C:
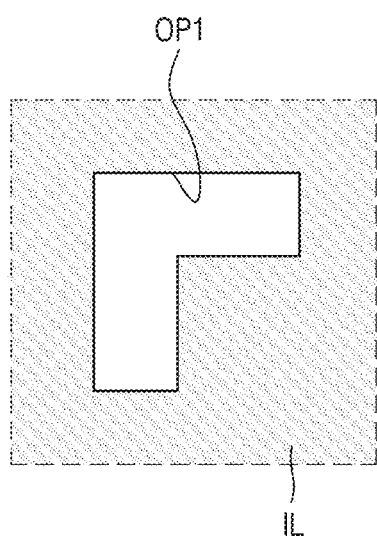

Referring to FIG. 7C, the shape of the first opening OP1 may be an English capital 'L.'

Figure 7D:
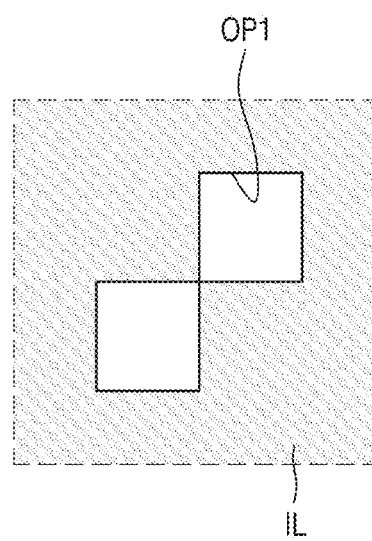

Referring to FIG. 7D, the first opening OP1 may be shaped as two squares sharing one apex.

Figure 7E:
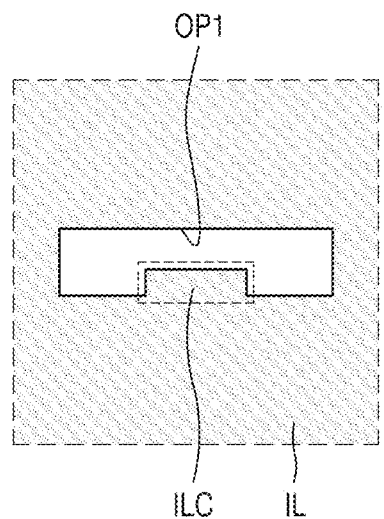
Figure 7F:
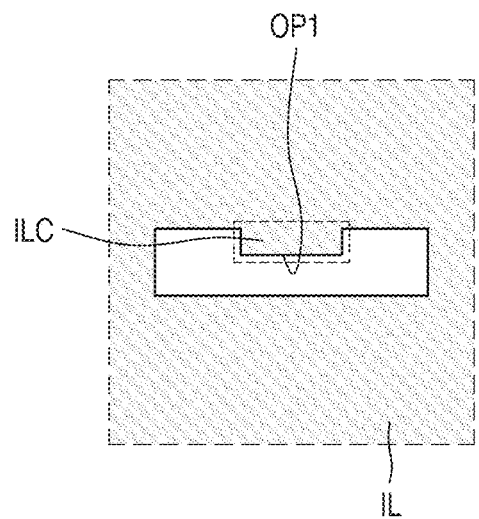
Figure 7G:
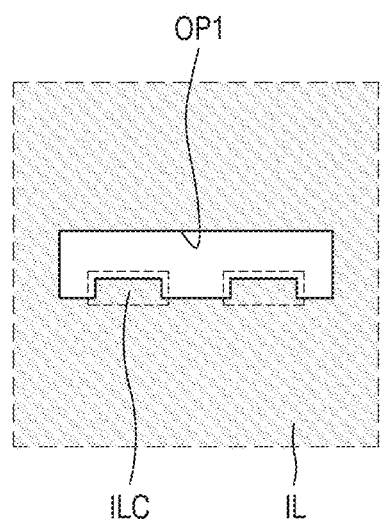

Referring to FIGS. 7E to 7G, the first opening OP1 may have at least one concave portion ILC in a plan view. In other words, the inorganic layer IL may have a portion protruding towards the first opening OP1 in a plan view. At least a portion of the concave portion ILC may be surrounded by the first opening OP1.

Referring to FIGS. 7E and 7F, the first opening OP1 may have one concave portion ILC in the plan view. Referring to FIG. 7G, the first opening OP1 may include a plurality of concave portions ILC in a plan view.

As described, the shape of the first opening OP1 may vary according to an area occupied by the first opening OP1. However, the shape of the first opening OP1 is not limited to the shape illustrated in FIGS. 7A to 7G.

Figure 8:
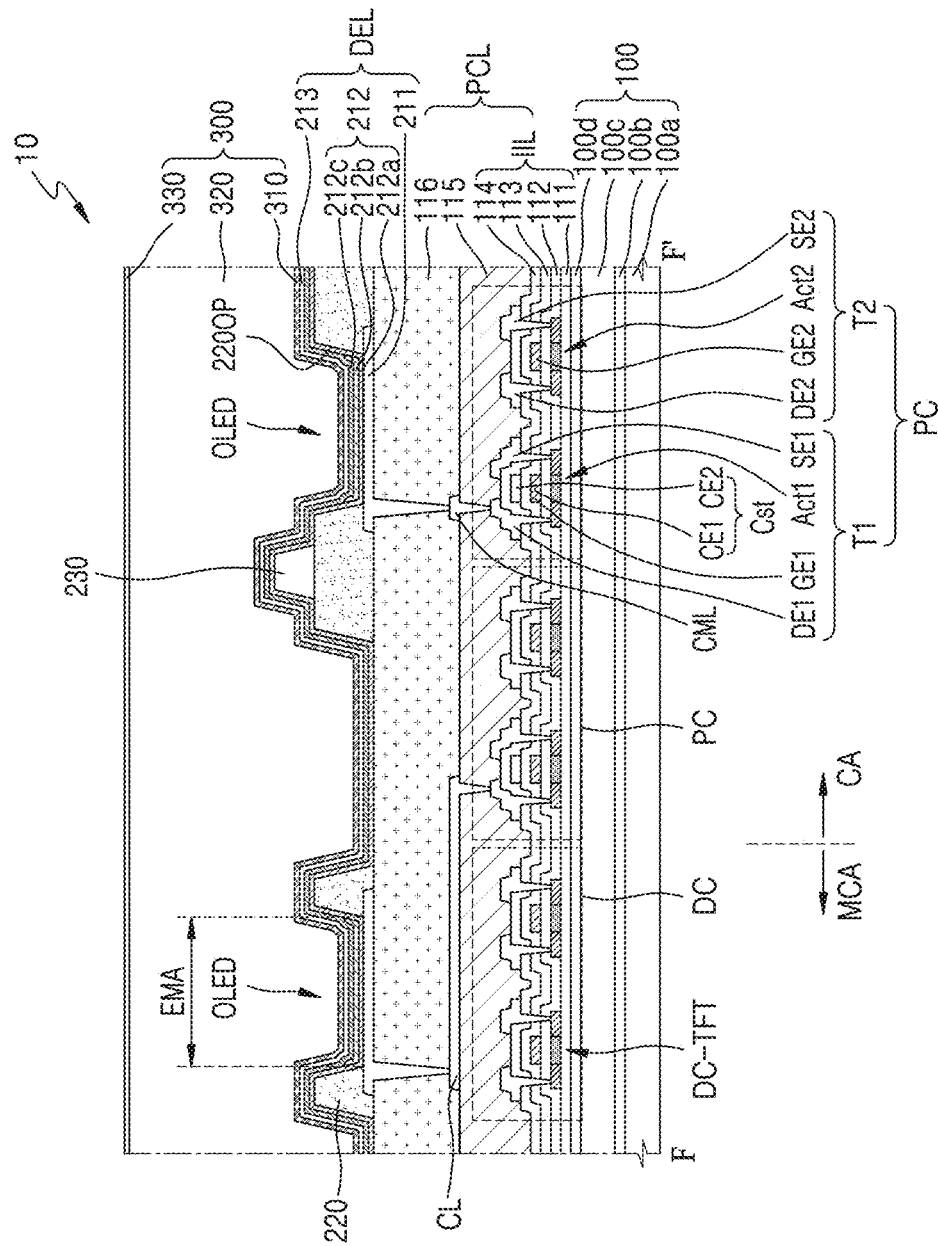
FIG. 8 is a cross-sectional view of the display panel of FIG. 5, taken along line F-F'.

FIG. 8 is a cross-sectional view of the display panel 10 of FIG. 5, taken along line F-F'.

Referring to FIG. 8, the display panel 10 may include the substrate 100, a pixel circuit layer PCL, a display element layer DEL, and an encapsulation layer 300. The substrate 100 may include the central area CA and the middle corner area MCA.

The substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked and included in the substrate 100. In another embodiment, the substrate 100 may include glass.

In an embodiment, at least one of the first base layer 100a and the second base layer 100c may include polymer resin such as polyethersulfone, polyarylate, polyetherimide, polyethylene naphthalate, polyethylene terephthalate, polyphenylene sulfide, polyimide, polycarbonate, cellulose triacetate, and cellulose acetate propionate.

In an embodiment, the first barrier layer 100b and the second barrier layer 100d may each be a barrier layer that prevents the penetration of external foreign materials and may each be a layer or layers including inorganic materials such as silicon nitride ($SiN_x$), silicon oxide ($SiO_2$), and/or silicon oxynitride (SiON).

The pixel circuit layer PCL may be arranged on the substrate 100. The pixel circuit layer PCL may include a driving circuit DC and a pixel circuit PC. In an embodiment, the driving circuit DC may be arranged in the middle corner area MCA.

The pixel circuit PC may be arranged in the central area CA. In an embodiment, the pixel circuit PC may be spaced apart from the middle corner area MCA. In other words, the pixel circuit PC may not overlap the middle corner area MCA. In another embodiment, the pixel circuit PC may overlap the middle corner area MCA.

The driving circuit DC may include a driving circuit thin film transistor DC-TFT. In an embodiment, the driving circuit DC may be connected to a scan line. Therefore, the driving circuit DC may provide a scan signal to the pixel circuit PC through the scan line. The pixel circuit PC may include at least one thin film transistor. In an embodiment, the pixel circuit PC may include the driving thin film transistor T1, the switching thin film transistor T2, and the storage capacitor Cst.

The pixel circuit layer PCL may further include an inorganic insulating layer IIL, a lower organic insulating layer 115, and an organic insulating layer 116 that are arranged under and/or on the components of the driving thin film transistor T1. The inorganic insulating layer IIL may include a buffer layer 111, a first gate insulating layer 112, a second gate insulating layer 113, and an inter-insulating layer 114. The driving thin film transistor T1 may include a first semiconductor layer Act1, a first gate electrode GE1, a first source electrode SE1, and a first drain electrode DE1.

The buffer layer 111 may be arranged on the substrate 100. In an embodiment, the buffer layer 111 may include inorganic insulating materials such as $SiN_x$, SiON, and $SiO_2$ and may be a layer or layers including the above inorganic insulating materials.

The first semiconductor layer Act1 may be arranged on the buffer layer 111. The first semiconductor layer Act1 may include polysilicon. In an alternative embodiment, the first semiconductor layer Act1 may include amorphous silicon, an oxide semiconductor, an organic semiconductor, or the like. The first semiconductor layer Act1 may include a channel area and drain and source areas arranged on both sides of the channel area.

The first gate electrode GE1 may overlap the channel area. The first gate electrode GE1 may include a low-resistance metal material. In an embodiment, the first gate electrode GE1 may include a conductive material such as molybdenum (Mo), aluminum (Al), copper (Cu), or titanium (Ti) and may be a layer or layers including the above conductive material.

In an embodiment, the first gate insulating layer 112 between the first semiconductor layer Act1 and the first gate electrode GE1 may include inorganic insulating materials such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). $ZnO_x$ may be ZnO and/or $ZnO_2$.

The second gate insulating layer 113 may cover the first gate electrode GE1. Similar to the first gate insulating layer 112, the second gate insulating layer 113 may include inorganic insulating materials such as $SiO_2$, $SiN_x$, SiON, $Al_2O_3$, $TiO_2$, $Ta_2O_5$, $HfO_2$, and/or $ZnO_x$. $ZnO_x$ may be ZnO and/or $ZnO_2$.

An upper electrode CE2 of the storage capacitor Cst may be arranged on the second gate insulating layer 113. The upper electrode CE2 may overlap the first gate electrode GE1 thereunder. In this case, the first gate electrode GE1 of the driving thin film transistor T1 and the upper electrode CE2, which overlap each other with the second gate insulating layer 113 therebetween, may provide the storage capacitor Cst. That is, the first gate electrode GE1 of the driving thin film transistor T1 may function as a lower electrode CE1 of the storage capacitor Cst. In other words, the storage capacitor Cst and the driving thin film transistor T1 may overlap each other. In some embodiments, the storage capacitor Cst and the driving thin film transistor T1 may not overlap each other. In an embodiment, the upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu and may be a layer or layers including the above materials.

The inter-insulating layer 114 may cover the upper electrode CE2. In an embodiment, the inter-insulating layer 114 may include $SiO_2$, $SiN_x$, SiON, $Al_2O_3$, $TiO_2$, $Ta_2O_5$, $HfO_2$, or $ZnO_x$. $ZnO_x$ may be ZnO and/or $ZnO_2$. The inter-insulating layer 114 may be a layer or layers including the above inorganic insulating material.

The first drain electrode DE1 and the first source electrode SE1 may be each arranged on the inter-insulating layer 114. The first drain electrode DE1 and the first source electrode SE1 may each include a material having high conductivity. In an embodiment, the first drain electrode DE1 and the first source electrode SE1 may each include a conductive material such as Mo, Al, Cu, or Ti and may be a layer or layers including the above material. In an embodiment, the first drain electrode DE1 and the first source electrode SE1 may have a multilayered structure of Ti/Al/Ti.

The switching thin film transistor T2 may include a second semiconductor layer Act2, a second gate electrode GE2, a second drain electrode DE2, and a second source electrode SE2. The second semiconductor layer Act2, the second gate electrode GE2, the second drain electrode DE2, and the second source electrode SE2 are similar to the first semiconductor layer Act1, the first gate electrode GE1, the first drain electrode DE1, and the first source electrode SE1, and thus, detailed descriptions thereof are omitted.

Similar to the switching thin film transistor T2, the driving circuit thin film transistor DC-TFT may include a driving circuit semiconductor layer, a driving circuit gate electrode, a driving circuit source electrode, and a driving circuit drain electrode.

The lower organic insulating layer 115 may be arranged on at least one thin film transistor. In an embodiment, the lower organic insulating layer 115 may cover the first drain electrode DE1 and the first source electrode SE1. The lower organic insulating layer 115 may include an organic material. In an embodiment, the lower organic insulating layer 115 may include organic insulating materials such as a general-purpose polymer such as polymethylmethacrylate ("PMMA") or polystyrene ("PS"), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any combinations thereof, for example.

A connection electrode CML and a connection line CL may be arranged on the lower organic insulating layer 115. In this case, the connection electrode CML and the connection line CL may be connected to the first drain electrode DE1 or the first source electrode SE1 through a contact hole of the lower organic insulating layer 115. The connection electrode CML and the connection line CL may each include a material having high conductivity. In an embodiment, the connection electrode CML and the connection line CL may each include a conductive material including Mo, Al, Cu, or Ti and may each be a layer or layers including the above material. In an embodiment, the connection electrode CML and the connection line CL may have a multilayered structure of Ti/Al/Ti.

In an embodiment, the connection line CL may extend from the central area CA towards the middle corner area MCA. In another embodiment, the connection line CL may extend towards the middle corner area MCA from the first area (A1 of FIG. 5), the second area (A2 of FIG. 5), the first adjacent corner area (ACA1 of FIG. 5), the second adjacent corner area (ACA2 of FIG. 5), and/or the central corner area (CCA of FIG. 5). The connection line CL may overlap the driving circuit thin film transistor DC-TFT.

The organic insulating layer 116 may cover the connection electrode CML and the connection line CL. The organic insulating layer 116 may include an organic material. In an embodiment, the organic insulating layer 116 may include organic insulating materials such as a general-purpose polymer such as PMMA or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any combinations thereof.

The display element layer DEL may be arranged on the pixel circuit layer PCL. The display element layer DEL may be a display element and may include an organic LED OLED, a pixel-defining layer 220, and a spacer 230. The display element layer DEL may include a plurality of organic LEDs OLED of a plurality of pixels. In an embodiment, any one of the plurality of organic LEDs OLED may be arranged in the central area CA. Another of the plurality of organic LEDs OLED may be arranged in the middle corner area MCA. Therefore, in the illustrated embodiment, the display panel 10 may display an image even in the middle corner area MCA where the driving circuit DC is arranged.

The organic LED OLED may be electrically connected to the connection electrode CML through a contract hole of the organic insulating layer 116. The organic LED OLED may be electrically connected to the connection line CL through the contract hole of the organic insulating layer 116. The organic LED OLED may include a first electrode 211, an intermediate layer 212, and a second electrode 213.

The first electrode 211 may be arranged on the organic insulating layer 116. The first electrode 211 may be electrically connected to the connection electrode CML or the connection line CL through the contract hole of the organic insulating layer 116. In an embodiment, the first electrode 211 may be a pixel electrode. In an embodiment, the first electrode 211 may include conductive oxide such as indium tin oxide ("ITO"), indium zinc oxide ("IZO"), ZnO, indium oxide ($In_2O_3$), indium gallium oxide ("IGO"), or aluminum zinc oxide ("AZO"). In another embodiment, the first electrode 211 may include a reflection layer including Ag, Mg, Al, Pt, Pd, Au, Ni, Nd, Ir, Cr, or any combinations thereof. In another embodiment, the first electrode 211 may further include a layer, which includes ITO, IZO, ZnO, or $In_2O_3$, on/under the above reflection layer.

On the first electrode 211, the pixel-defining layer 220 defining an opening 220OP may be arranged, where the opening 220OP exposes a central portion of the first electrode 211. The opening 220OP may define an emission area EMA of light emitted from the organic LED OLED. In an embodiment, a width of the opening 220OP may correspond to a width of the emission area EMA. Also, the width of the opening 220OP may correspond to a width of a sub-pixel, for example.

In an embodiment, the pixel-defining layer 220 may include an organic insulating material. In another embodiment, the pixel-defining layer 220 may include an inorganic insulating material such as $SiN_x$, SiON, or $SiO_2$. In another embodiment, the pixel-defining layer 220 may include an organic insulating material and an inorganic insulating material. In some embodiments, the pixel-defining layer 220 may include a light-shield material and may be black. In an embodiment, the light-shield material may include carbon black, a carbon nanotube, resin or paste including a black dye, metal particles such as Ni, Al, Mo, or any alloys thereof, metal oxide particles (e.g., chromium oxide), or metal nitride particles (e.g., chromium nitride), or the like. When the pixel-defining layer 220 includes the light-shield material, external light reflection by metal structures arranged under the pixel-defining layer 220 may decrease.

The spacer 230 may be arranged on the pixel-defining layer 220. The spacer 230 may prevent damage to the substrate 100 and/or a multilayered film on the substrate 100 in a method of manufacturing a display device. According to the method of manufacturing a display device, a mask sheet may be used, and in this case, the mask sheet may be introduced to the inside of the opening 220OP of the pixel-defining layer 220 or attached to the pixel-defining layer 220. The spacer 230 may prevent or decrease defects such as damage to or breakage of the substrate 100 or the multilayered film by the mask sheet, when a deposition material is deposited on the substrate 100.

The spacer 230 may include an organic material such as polyimide. In an alternative embodiment, the spacer 230 may include an inorganic insulating material such as $SiN_x$ or $SiO_2$ or may include organic and inorganic insulating materials. In an embodiment, the spacer 230 may include a material different from that of the pixel-defining layer 220. In an alternative embodiment, the spacer 230 may include the same material as that of the pixel-defining layer 220, and in this case, the pixel-defining layer 220 and the spacer 230 may be formed or provided together during a mask process using a half-tone mask.

The intermediate layer 212 may be arranged on the pixel-defining layer 220. The intermediate layer 212 may include an emission layer 212b arranged in the opening 220OP of the pixel-defining layer 220. The emission layer 212b may include a polymer organic material or a low-molecular-weight organic material that emits a predetermined color of light.

The intermediate layer 212 may further include at least one of a first functional layer 212a between the first electrode 211 and the emission layer 212b and a second functional layer 212c between the emission layer 212b and the second electrode 213. In an embodiment, the first functional layer 212a and the second functional layer 212c may be arranged on and under the emission layer 212b, respectively. In an embodiment, the first functional layer 212a may include, for example, a hole transport layer ("HTL") and/or a hole injection layer ("HU). The second functional layer 212c may include an electron transport layer ("ETU) and/or an electron injection layer ("EIL"). The first functional layer 212a and/or the second functional layer 212c may be common layers formed or provided to cover an entirety of the substrate 100 like the second electrode 213 described below.

The second electrode 213 may be arranged on the intermediate layer 212. In an embodiment, the second electrode 213 may be an opposite electrode. The second electrode 213 may include a conductive material having a low work function. In an embodiment, the second electrode 213 may include a transparent (or translucent) layer including Ag, Mg, Al, Pt, Pd, Au, Ni, Nd, Ir, Cr, Li, Ca, or any alloys thereof. In an alternative embodiment, the second electrode 213 may further include a layer on the transparent (or translucent) layer including the above materials, where the layer includes ITO, IZO, ZnO, or $In_2O_3$.

In some embodiments, a capping layer (not illustrated) may be further arranged on the second electrode 213. The capping layer may include an inorganic material such as LiF, and/or an organic material.

The encapsulation layer 300 may be arranged on the second electrode 213. In an embodiment, the encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330 that are sequentially stacked.

In an embodiment, the first inorganic encapsulation layer 310 and the second inorganic encapsulation layer 330 may each include at least one inorganic material from among $Al_2O_3$, $TiO_2$, $Ta_2O_5$, $HfO_2$, $ZnO_x$, $SiO_2$, $SiN_x$, and SiON. $ZnO_x$ may be ZnO and/or $ZnO_2$. The organic encapsulation layer 320 may include a polymer-based material. In an embodiment, the polymer-based material may include at least one of an acryl-based material, an epoxy-based material, polyimide, and polyethylene. In an embodiment, the organic encapsulation layer 320 may include acrylate.

Although not illustrated, a touch electrode layer may be arranged on the encapsulation layer 300, and an optical functional layer may be arranged on the touch electrode layer. The touch electrode layer may obtain coordinate information according to an external input, for example, a touch event. The optical functional layer may decrease the reflectivity of light (external light) that is incident towards the display device, and/or may improve the color purity of light emitted from the display device. In an embodiment, the optical functional layer may include a retarder and/or a polarizer. In an embodiment, the retarder may be of a film type or a liquid crystal coating type and may include a $\lambda/2$ retarder and/or a $\lambda/4$ retarder. In an embodiment, the polarizer may also be of a film type or a liquid crystal coating type. In an embodiment, the film type may include a stretched synthetic resin film, and the liquid crystal coating type may include liquid crystals arranged in a predetermined arrangement. The retarder and the polarizer may further include a protective film.

In another embodiment, the optical functional layer may include a black matrix and color filters. The color filters may be arranged considering colors of light respectively emitted from the pixels of the display panel. In an embodiment, each color filter may include a red, green, or blue pigment or dye. In an alternative embodiment, each color filter may further include quantum dots in addition to the above pigment or dye. In an alternative embodiment, some of the color filters may not include the above pigment or dye and may include scattered particles such as titanium oxide.

In another embodiment, the optical functional layer may include a destructive interference structure. The destructive interference structure may include a first reflection layer and a second reflection layer that are at different layers. First reflection light and second reflection light, which are respectively reflected from the first reflection layer and the second reflection layer, may destructively interfere in each other, and the external light reflectivity may decrease accordingly.

An adhesive member may be arranged between the touch electrode layer and the optical functional layer. General adhesive members well known to the field may be employed without limitation. In an embodiment, the adhesive member may be a pressure sensitive adhesive ("PSA").

Figure 9:
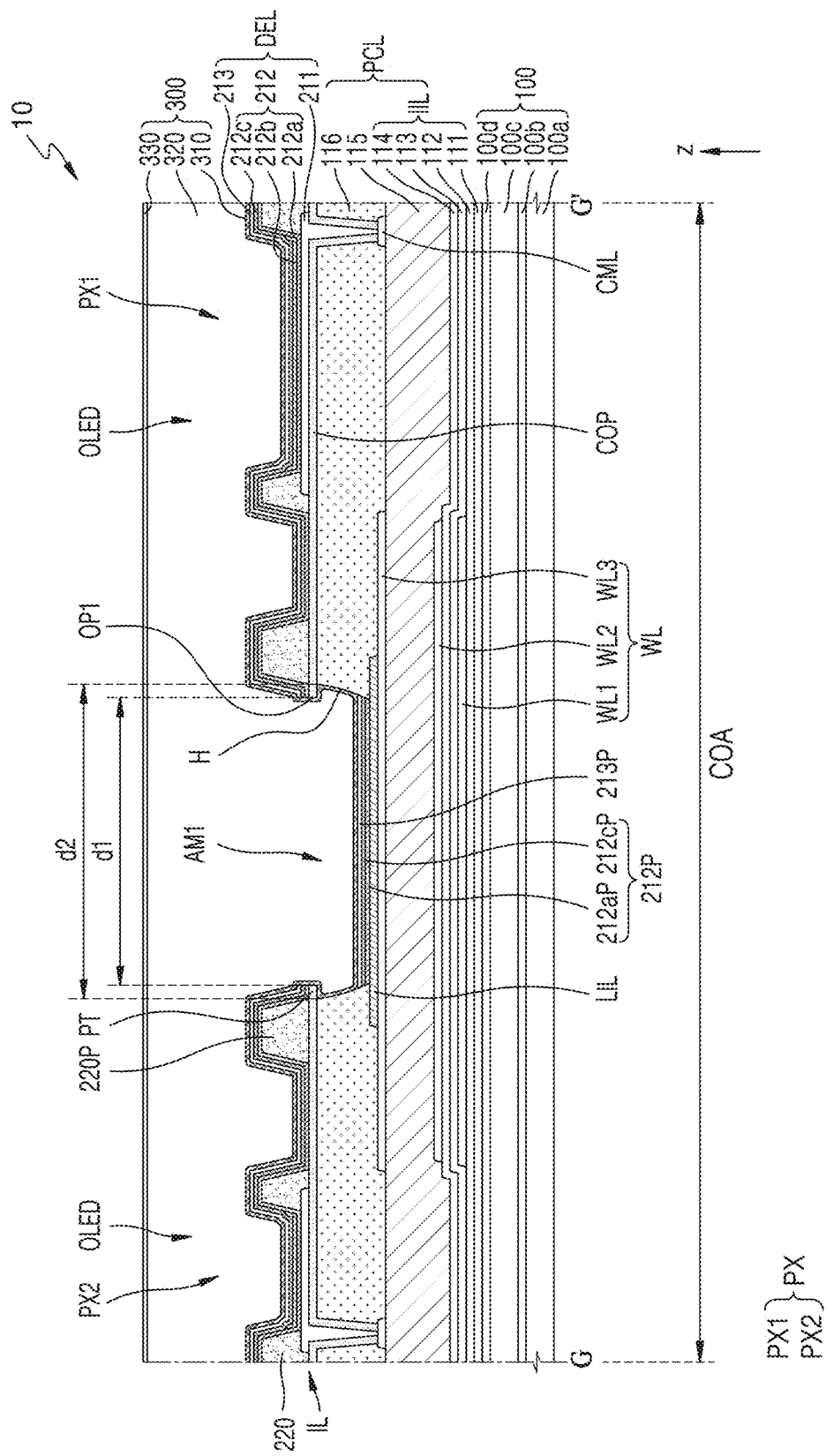
FIG. 9 is a cross-sectional view of the display panel of FIG. 6, taken along line G-G'.

FIG. 9 is a cross-sectional view of the display panel 10 of FIG. 6, taken along line G-G'. In FIG. 9, the same reference symbols as those in FIG. 8 denote the same members, and thus, repeated descriptions thereof are omitted.

Referring to FIG. 9, the display panel 10 may include the substrate 100, the pixel circuit layer PCL, a lower inorganic layer LIL, the inorganic layer IL, the display element layer DEL, and the encapsulation layer 300. The substrate 100 may include the corner area COA.

The pixel circuit layer PCL may be arranged on the substrate 100. The pixel circuit layer PCL may include the inorganic insulating layer IIL, the lower organic insulating layer 115, the organic insulating layer 116, a wire WL, and the connection electrode CML. The inorganic insulating layer IIL may include the buffer layer 111, the first gate insulating layer 112, the second gate insulating layer 113, and the inter-insulating layer 114.

The wire WL may be arranged in the corner area COA. The wire WL may transmit a power voltage and/or a signal to the organic LED OLED. In an embodiment, the wire WL may include a first wire WL1, a second wire WL2, and a third wire WL3. In an embodiment, the first wire WL1 may be arranged between the first gate insulating layer 112 and the second gate insulating layer 113. In another embodiment, the first wire WL1 may be arranged between the second gate insulating layer 113 and the inter-insulating layer 114. The second wire WL2 may be arranged between the inter-insulating layer 114 and the lower organic insulating layer 115. The third wire WL3 may be arranged between the lower organic insulating layer 115 and the organic insulating layer 116.

The connection electrode CML may be arranged on the lower organic insulating layer 115. Although not illustrated, the connection electrode CML may be connected to a pixel circuit PC.

The lower inorganic layer LIL may overlap the corner area COA. In an embodiment, the lower inorganic layer LIL may be arranged between the substrate 100 and the organic insulating layer 116. In an embodiment, the lower inorganic layer LIL may be arranged between the lower organic insulating layer 115 and the organic insulating layer 116, for example. In another embodiment, the lower inorganic layer LIL may be arranged between the inorganic insulating layer IIL and the lower organic insulating layer 115.

The organic insulating layer 116 may be arranged on the lower inorganic layer LIL and the lower organic insulating layer 115. The organic insulating layer 116 may cover an edge of the third wire WL3. Therefore, the organic insulating layer 116 may prevent or decrease the deterioration of a side surface of the third wire WL3. A hole H may be defined in the organic insulating layer 116. In an embodiment, the hole H may overlap the lower inorganic layer LIL. The hole H may penetrate the organic insulating layer 116. In this case, the hole H may expose the lower inorganic layer LIL. The hole H may be defined by etching the organic insulating layer 116, and the lower inorganic layer LIL may prevent or decrease over-etching of components arranged under the lower inorganic layer LIL. In an embodiment, the lower inorganic layer LIL may prevent or decrease a resistance increase caused by the over-etching of the third wire WL3, for example. In some embodiments, the hole H may not penetrate the organic insulating layer 116. In this case, the hole H may be a groove of the organic insulating layer 116.

The inorganic layer IL may be arranged on the organic insulating layer 116. The inorganic layer IL may include an overlapping inorganic pattern COP. In an embodiment, the organic insulating layer 116 may be arranged between the substrate 100 and the inorganic layer IL, and the hole H may be defined in the organic insulating layer 116. The first opening OP1 overlapping the hole H may be defined in the inorganic layer IL. In an embodiment, the first opening OP1 may be defined in the overlapping inorganic pattern COP. The first opening OP1 and the hole H may each be a passage through which gas generated from the lower organic insulating layer 115 and the organic insulating layer 116 is discharged. Therefore, the reliability of the display panel 10 may be improved. Also, the first opening OP1 may function as the first alignment mark AM1.

A size of the first opening OP1 may be less than that of the hole H. In an embodiment, a portion of an inner side surface of the inorganic layer IL, which defines the first opening OP1, may be spaced apart from another portion of the inner side surface of the inorganic layer IL, which defines the first opening OP1, by a first distance d1, for example. A portion of an upper surface of the organic insulating layer 116 facing the inorganic layer IL may be spaced apart from another portion of the upper surface of the organic insulating layer 116 facing the inorganic layer IL by a second distance d2 with the hole H therebetween. In other words, the inorganic layer IL may have a protruding tip PT that protrudes towards the center of the hole H. Therefore, a lower surface of the protruding tip PT of the inorganic layer IL may be exposed in the hole H.

The display element layer DEL may be arranged on the inorganic layer IL. The display element layer DEL may include a plurality of organic LEDs OLED as a plurality of display elements, the pixel-defining layer 220, and a pixel-defining layer pattern 220P. In an embodiment, the display element layer DEL may include the plurality of organic LEDs OLED as the plurality of display elements of the plurality of pixels PX. The organic LED OLED may include the first electrode 211, the intermediate layer 212 including the emission layer 212b, and the second electrode 213, which are stacked in sequence. Any one of the plurality of organic LEDs OLED may be included in the first pixel PX1. Another of the plurality of organic LEDs OLED may be included in the second pixel PX2. The plurality of organic LEDs OLED may be respectively connected to the connection electrode CML through the contact hole of the organic insulating layer 116.

The pixel-defining layer pattern 220P may be arranged around the first opening OP1. In an embodiment, the pixel-defining layer pattern 220P and the pixel-defining layer 220 may include the same material as each other. In an embodiment, the pixel-defining layer pattern 220P and the pixel-defining layer 220 may be separated from each other. In another embodiment, the pixel-defining layer pattern 220P and the pixel-defining layer 220 may be unitary.

The protruding tip PT may be a component for improving the reliability of the display panel 10. At least one of the first functional layer 212a and the second functional layer 212c may include an organic material, and external oxygen or moisture may be introduced to the organic LED OLED through at least one of the first functional layer 212a and the second functional layer 212c. Such oxygen or moisture may damage the organic LED OLED. In the illustrated embodiment, because the inorganic layer IL includes the protruding tip PT protruding towards the center of the hole H, each of the first functional layer 212a and the second functional layer 212c may be disconnected with respect to the hole H. Therefore, the introduction of external oxygen or moisture to the organic LED OLED may be prevented or decrease. Therefore, the reliability of the display panel 10 may be improved.

In an embodiment, a functional layer pattern 212P including at least one of a first functional layer pattern 212aP and a second functional layer pattern 212cP may be arranged in the hole H, where the first functional layer pattern 212aP includes the same material as that of the first functional layer 212a and the second functional layer pattern 212cP includes the same material as that of the second functional layer 212c. In an embodiment, an electrode pattern 213P, which includes the same material as that of the second electrode 213, may be arranged on the functional layer pattern 212P.

The encapsulation layer 300 may be arranged on the display element layer DEL. The encapsulation layer 300 may include at least one inorganic encapsulation layer and at least one organic encapsulation layer. In an embodiment, the encapsulation layer 300 may include the first inorganic encapsulation layer 310, the organic encapsulation layer 320, and the second inorganic encapsulation layer 330.

The first inorganic encapsulation layer 310 may be arranged in an entirety of the corner area COA. The first inorganic encapsulation layer 310 may directly contact the protruding tip PT of the inorganic layer IL. In an embodiment, the first inorganic encapsulation layer 310 may directly contact the lower surface of the protruding tip PT of the inorganic layer IL. Therefore, the introduction of external oxygen or moisture to the organic LED OLED may be prevented or decreased.

The organic encapsulation layer 320 may be arranged on the first inorganic encapsulation layer 310. In an embodiment, the organic encapsulation layer 320 may fill the hole H and the first opening OP1. The organic encapsulation layer 320 may prevent or decrease the generation of cracks in the protruding tip PT.

The second inorganic encapsulation layer 330 may be arranged on the organic encapsulation layer 320.

Figure 10:
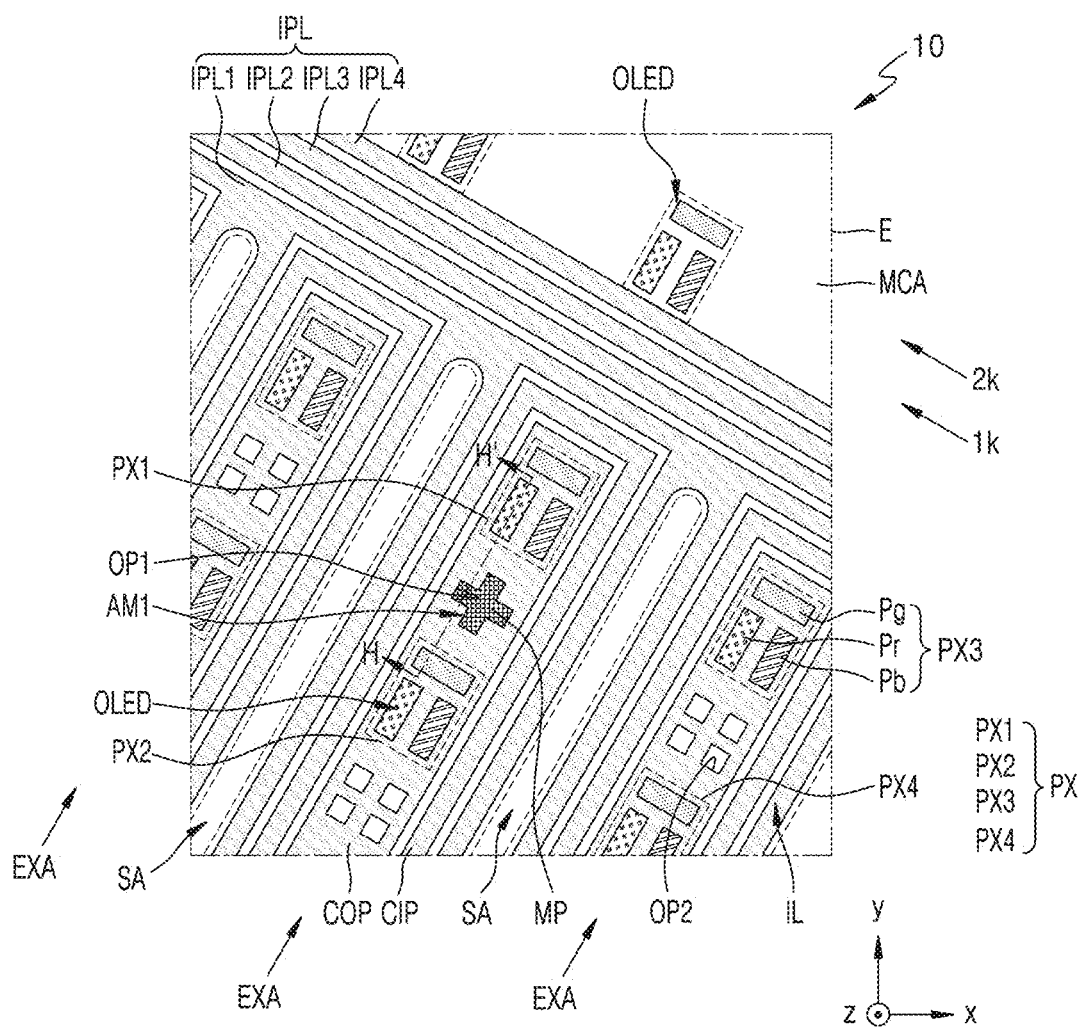
FIG. 10 is an enlarged diagram illustrating another embodiment of a region E of the display panel of FIG. 5.

FIG. 10 is an enlarged diagram illustrating another embodiment of a region E of the display panel 10 of FIG. 5. In FIG. 10, the same reference symbols as those in FIG. 6 denote the same members, and thus, repeated descriptions thereof are omitted.

Referring to FIG. 10, the display panel 10 may include the substrate 100 (refer to FIGS. 8 and 9), the pixel PX, the inorganic layer IL, and a metal pattern MP. The pixel PX, the inorganic layer IL, and the metal pattern MP may be arranged on the substrate 100.

The first opening OP1 arranged between the first pixel PX1 and the second pixel PX2 and the second opening OP2 arranged between the third pixel PX3 and the fourth pixel PX4 may be defined in the inorganic layer IL. In an embodiment, the first pixel PX1 and the second pixel PX2 may overlap the overlapping inorganic pattern COP, and the first opening OP1 may be defined in the overlapping inorganic pattern COP. In an embodiment, the third pixel PX3 and the fourth pixel PX4 may overlap the overlapping inorganic pattern COP, and the second opening OP2 may be defined in the overlapping inorganic pattern COP.

The shape of the first opening OP1 may be different from that of the second opening OP2. The planar area of the first opening OP1 may be greater than that of the second opening OP2. In an embodiment, the first opening OP1 may be arranged between the first pixel PX1 and the second pixel PX2, and the second openings OP2 may be arranged between the third pixel PX3 and the fourth pixel PX4, for example.

The metal pattern MP may overlap the first opening OP1. In an embodiment, the metal pattern MP may include a reflection layer including Ag, Mg, Al, Pt, Pd, Au, Ni, Nd, Ir, Cr, or any combinations thereof. In another embodiment, the metal pattern MP may include Mo, Al, Cu, Ti, or any combinations thereof. In another embodiment, metal included in the metal pattern MP is not limited thereto and may include various metal materials. Therefore, the metal pattern MP and the first opening OP1 may function as the first alignment mark AM1 having high reflectivity, and the first alignment mark AM1 may be easily recognized.

Figure 11:
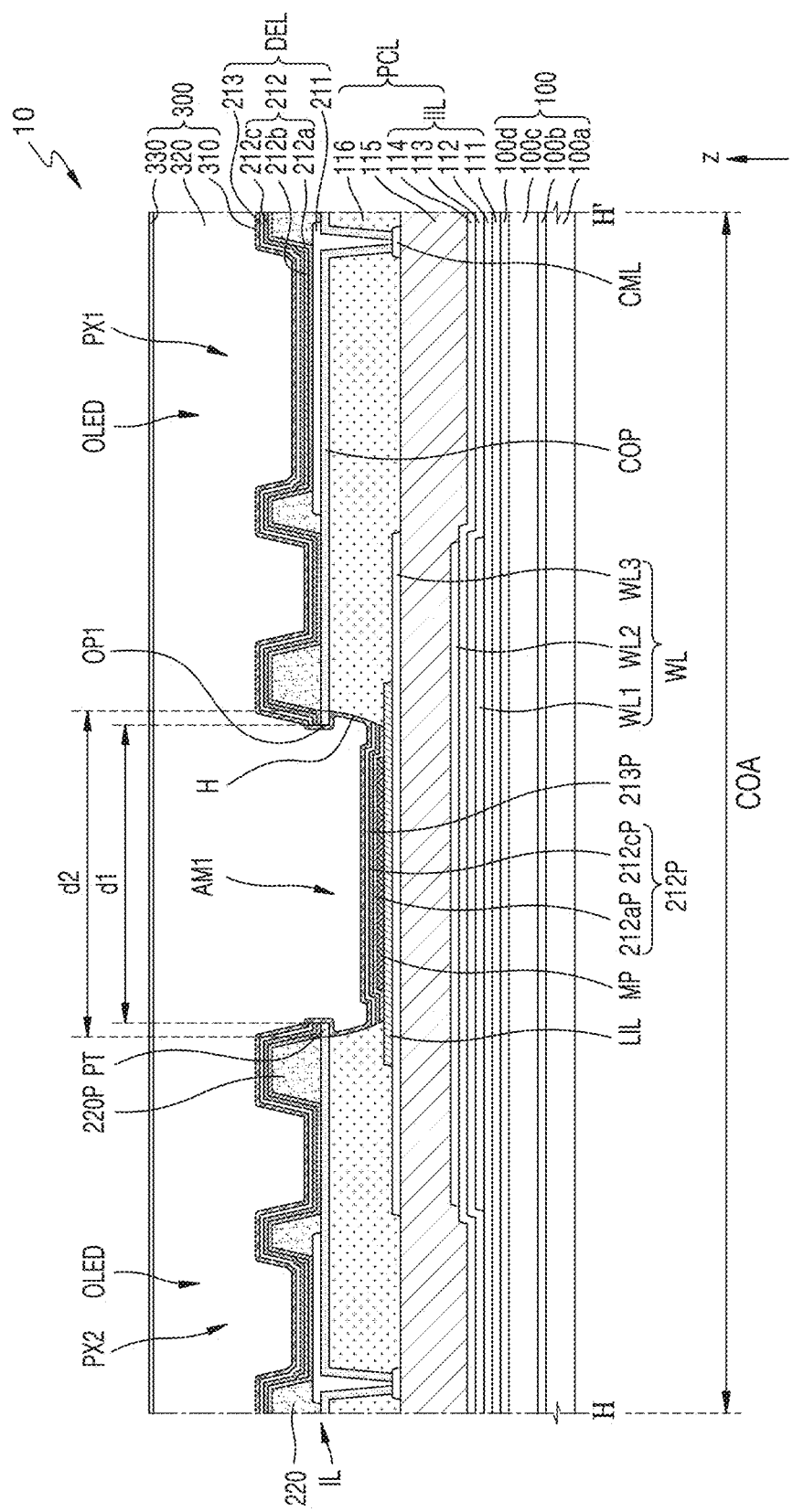
FIG. 11 is a cross-sectional view of the display panel of FIG. 10, taken along line H-H'.

FIG. 11 is a cross-sectional view of the display panel 10 of FIG. 10, taken along line H-H'. In FIG. 11, the same reference symbols as those in FIG. 9 denote the same members, and thus, repeated descriptions thereof are omitted.

Referring to FIG. 11, the display panel 10 may include the substrate 100, the pixel circuit layer PCL, the lower inorganic layer LIL, the metal pattern MP, the inorganic layer IL, the display element layer DEL, and the encapsulation layer 300. The substrate 100 may include the corner area COA.

The pixel circuit layer PCL may be arranged on the substrate 100. The pixel circuit layer PCL may include the inorganic insulating layer IIL, the lower organic insulating layer 115, the organic insulating layer 116, the wire WL, and the connection electrode CML.

The lower inorganic layer LIL may overlap the corner area COA. In an embodiment, the lower inorganic layer LIL may be arranged between the substrate 100 and the organic insulating layer 116. The organic insulating layer 116 may be arranged on the lower inorganic layer LIL and the lower organic insulating layer 115. The hole H may be defined in the organic insulating layer 116.

The metal pattern MP may overlap the first opening OP1. In an embodiment, the metal pattern MP may overlap the hole H of the organic insulating layer 116. In an embodiment, the metal pattern MP may be arranged on the lower inorganic layer LIL. In an embodiment, the functional layer pattern 212P and the electrode pattern 213P may be arranged on the metal pattern MP. Therefore, the metal pattern MP and the first opening OP1 may function as the first alignment mark AM1 having the high reflectivity, and the first alignment mark AM1 may be easily recognized.

Figure 12:
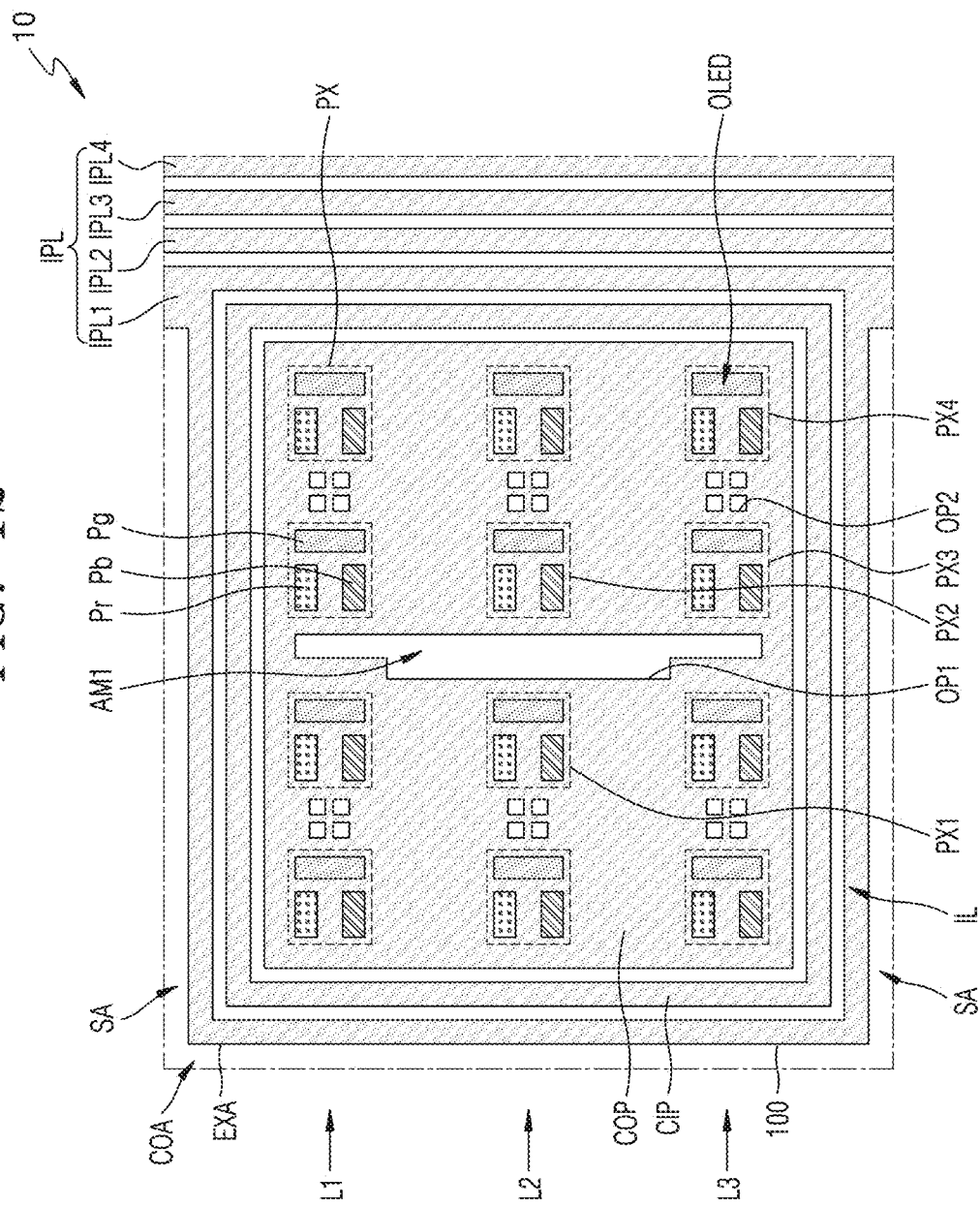
FIG. 12 is a plan view of an embodiment of a corner area.

FIG. 12 is a plan view of an embodiment of the corner area COA. In FIG. 12, the same reference symbols as those in FIG. 6 denote the same members, and thus, repeated descriptions thereof are omitted.

Referring to FIG. 12, the display panel 10 may include the substrate 100, the pixel PX, and the inorganic layer IL. The pixel PX and the inorganic layer IL may be arranged on the substrate 100. The substrate 100 may include a central area and the corner area COA.

The corner area COA may include a central corner area, a first adjacent corner area, a second adjacent corner area, and a middle corner area. The central corner area may include an extension area EXA. The extension area EXA may extend in a direction away from the central area. In an embodiment, the corner area COA may include a plurality of extension areas EXA. In this case, the separation area SA may be defined between adjacent extension areas EXA.

The plurality of pixels PX may be arranged along a plurality of lines in the plurality of extension areas EXA. In an embodiment, in one extension area EXA, the plurality of pixels PX may be arranged along a first line L1, a second line L2, and a third line L3. The first line L1 may be adjacent to the second line L2. Also, the second line L2 may be adjacent to the third line L3.

In an embodiment, the pixel PX may include the red sub-pixel Pr, the green sub-pixel Pg, and the blue sub-pixel Pb. The red sub-pixel Pr, the green sub-pixel Pg, and the blue sub-pixel Pb may emit red light, green light, and blue light, respectively. In an embodiment, the red sub-pixel Pr, the green sub-pixel Pg, and the blue sub-pixel Pb may be arranged in the form of S-stripe. In an alternative embodiment, unlike the illustration, the red sub-pixel Pr, the green sub-pixel Pg, and the blue sub-pixel Pb may be arranged side by side or in the form of PenTile™.

In an embodiment, the plurality of pixels PX may include the first pixel PX1, the second pixel PX2, the third pixel PX3, and the fourth pixel PX4. The first pixel PX1, the second pixel PX2, the third pixel PX3, and the fourth pixel PX4 may overlap the corner area COA. In an embodiment, the first pixel PX1, the second pixel PX2, the third pixel PX3, and the fourth pixel PX4 may be arranged in the extension area EXA.

The inorganic layer IL may overlap the corner area COA. The inorganic layer IL may include the overlapping inorganic pattern COP, the corner inorganic pattern CIP, and the inorganic pattern line IPL. The overlapping inorganic pattern COP may extend in the extension direction of the extension area EXA. The corner inorganic pattern CIP may surround the overlapping inorganic pattern COP. The inorganic pattern line IPL may surround at least a portion of the central area. The inorganic pattern line IPL may include the first inorganic pattern line IPL1, the second inorganic pattern line IPL2, the third inorganic pattern line IPL3, and the fourth inorganic pattern line IPL4. In an embodiment, the first inorganic pattern line IPL1 may extend in the extension direction of the extension area EXA and may surround at least a portion of the corner inorganic pattern CIP.

The first opening OP1 arranged between the first pixel PX1 and the second pixel PX2 and the second opening OP2 arranged between the third pixel PX3 and the fourth pixel PX4 may be defined in the inorganic layer IL. In an embodiment, the first pixel PX1, the second pixel PX2, the third pixel PX3, and the fourth pixel PX4 may overlap the overlapping inorganic pattern COP, and the first opening OP1 and the second opening OP2 may be defined in the overlapping inorganic pattern COP. The first opening OP1 and the second opening OP2 may not overlap the organic LED OLED as a display element.

The first opening OP1 and the second opening OP2 may become passages through which gas generated from a layer including an organic material is discharged, where the layer is arranged under the inorganic layer IL. Therefore, the reliability of the display panel 10 may be improved.

At least one first opening OP1 may be defined in the corner area COA. In an embodiment, one first opening OP1 may be defined in the corner area COA, for example. In another embodiment, the plurality of first openings OP1 may be spaced apart from each other in the corner area COA.

The first opening OP1 may extend to cross the plurality of lines. In an embodiment, the first opening OP1 may extend from the second line L2 to the first line L1, for example. The first opening OP1 may extend from the second line L2 to the third line L3.

The second opening OP2 may be provided in plural. In an embodiment, the plurality of second openings OP2 may be arranged between the third pixel PX3 and the fourth pixel PX4.

The shape of the first opening OP1 may be different from that of the second opening OP2. In an embodiment, the first opening OP1 may have a shape in which a width of the first opening OP1 in a direction, in which the plurality of pixels PX is arranged in the second line L2, is greater than a width of the first opening OP1 in a direction, in which the plurality of pixels PX is arranged in the first line L1, for example. Also, the first opening OP1 may have a shape in which the width of the first opening OP1 in a direction, in which the plurality of pixels PX is arranged in the second line L2, is greater than a width of the first opening OP1 in a direction, in which the plurality of pixels PX is arranged in the third line L3. The shape of the second opening OP2 may be a quadrangular (e.g., square). Therefore, the first opening OP1 may be the first alignment mark AM1. In an alternative embodiment, the first opening OP1 may function as the first alignment mark AM1.

The planar area of the first opening OP1 may be greater than that of the second opening OP2. In an embodiment, the first opening OP1 between the first pixel PX1 and the second pixel PX2 may extend to cross the lines, for example. The second opening OP2 between the third pixel PX3 and the fourth pixel PX4 may be provided in plural. In the illustrated embodiment, because the planar area of the first opening OP1 is greater than that of the second opening OP2, the first opening OP1 may be recognized as the first alignment mark AM1.

Figure 13A:
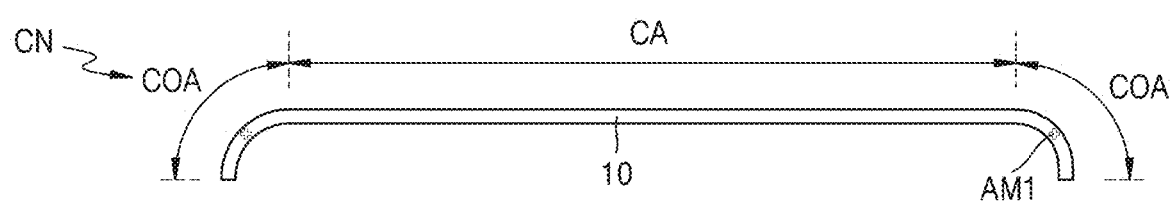
FIGS. 13A and 13B are diagrams of a method of aligning a display panel and a cover window.
Figure 13B:
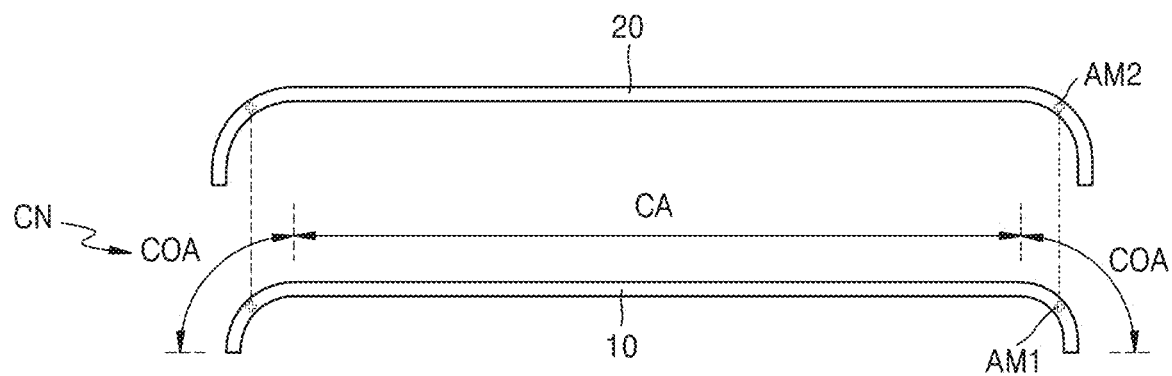

FIGS. 13A and 13B are diagrams of a method of aligning the display panel 10 and the cover window 20. In FIGS. 13A and 13B, the same reference symbols as those in FIG. 2C denote the same members, and thus, repeated descriptions thereof are omitted.

Referring to FIG. 13A, the display panel 10 including the first alignment mark AM1 may be prepared. The display panel 10 may include the central area CA and the corner area COA arranged on an outer side of the central area CA. The first alignment mark AM1 may be arranged in the corner area COA. In an embodiment, the first alignment mark AM1 may be a first opening of an inorganic layer included in the display panel 10. In an embodiment, the first alignment mark AM1 may be the first opening and a metal pattern overlapping the first opening. In this case, the first alignment mark AM1 may be arranged between pixels that are adjacent to each other in the corner area COA. Therefore, the corner area COA may be an area where an image is displayed and also be an area where the first alignment mark AM1 is arranged.

Next, the display panel 10 may be bent. In an embodiment, at least a portion of the corner area COA may be bent in a vacuum state after a guide film is arranged under the display panel 10. In an embodiment, the corner area COA may be bent according to thermal forming.

At least a portion of the corner area COA may be bent in a cross-section of the display panel 10 in a first direction. In this case, at least a portion of the corner area COA may not be bent in a cross-section of the display panel 10 in a second direction that crosses the first direction. Therefore, a location of the first alignment mark AM1 may not change in the second direction.

Referring to FIG. 13B, the cover window 20 including the second alignment mark AM2 may be prepared. In an embodiment, the cover window 20 may be bent.

Next, the display panel 10 and the cover window 20 may be aligned. In an embodiment, the display panel 10 and the cover window 20 may be aligned by the first alignment mark AM1 of the display panel 10 and the second alignment mark AM2 of the cover window 20.

As described above, while the display panel 10 is bent, the alignment between the display panel 10 and the cover window 20 may be warped. Therefore, through an alignment process using the first alignment mark AM1 and the second alignment mark AM2, the display panel 10 and the cover window 20 may be aligned again with respect to each other at preset locations, and process orders may decrease.

Next, at least a portion of the corner area COA may be bent in the cross-section of the display panel 10 in the second direction that crosses the first direction. Therefore, at least a portion of the corner area COA may be bent in the cross-section of the display panel 10 in the first direction and in the cross-section of the display panel 10 in the second direction.

The display panel 10 may be attached to the cover window 20. In an embodiment, the display panel 10 and the cover window 20 may be connected to each other by an optically clear adhesive (not illustrated). In an embodiment, the display panel 10 and the cover window 20 may be attached to each other through a lamination process.

In an embodiment, a display panel may include an inorganic layer in which a first opening, which is arranged between a first pixel and a second pixel, and a second opening, which is arranged between a third pixel and a fourth pixel are defined. In this case, a shape of the first opening may be different from that of the second opening. Therefore, the first opening may function as a first alignment mark of the display panel. Also, the display panel may display an image in a corner area and may include the first alignment mark.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display panel comprising:
a substrate comprising a central area and a corner area on an outer side of the central area;
a plurality of pixels arranged on the substrate and comprising a first pixel, a second pixel, a third pixel, and a fourth pixel which overlap the corner area; and
a first inorganic layer including an overlapping inorganic pattern and a corner inorganic pattern,
wherein the overlapping inorganic pattern defines a first opening, which is arranged between the first pixel and the second pixel, and a second opening, which is arranged between the third pixel and the fourth pixel,
wherein the corner inorganic pattern surrounds the overlapping inorganic pattern, and
wherein a shape of the first opening is different from a shape of the second opening.

2. The display panel of claim 1, wherein an area of the first opening is greater than an area of the second opening in a plan view.

3. The display panel of claim 1, further comprising a metal pattern overlapping the first opening.

4. The display panel of claim 1, further comprising:
an organic insulating layer arranged between the substrate and the first inorganic layer and defining a hole overlapping the first opening; and
a display element layer arranged on the first inorganic layer and comprising a plurality of display elements of the plurality of pixels.

5. The display panel of claim 4, further comprising:
a second inorganic layer arranged between the substrate and the organic insulating layer; and
a wire arranged between the substrate and the second inorganic layer,
wherein the second inorganic layer overlaps the hole.

6. The display panel of claim 4, wherein the first inorganic layer comprises a protruding tip protruding towards a center of the hole.

7. The display panel of claim 6, further comprising an encapsulation layer arranged on the display element layer and comprising an inorganic encapsulation layer and an organic encapsulation layer,
wherein the inorganic encapsulation layer directly contacts the protruding tip.

8. The display panel of claim 1, wherein the corner area comprises a plurality of extension areas respectively extending in a direction away from the central area, and
a separation area is defined between adjacent extension areas of the plurality of extension areas.

9. The display panel of claim 8, wherein the plurality of pixels is arranged along a plurality of lines in the plurality of extension areas, and
the first opening extends to cross the plurality of lines.

10. The display panel of claim 1, wherein the substrate further comprises a first area, which extends from the central area in a first direction, and a second area, which extends from the central area in a second direction crossing the first direction, and
the corner area partially surrounds at least a part of the first area, the central area, and the second area.

11. An electronic device comprising:
a display device comprising:
a display panel comprising:
a substrate comprising a central area and a corner area which is bent on an outer side of the central area;
a plurality of pixels arranged on the substrate and comprising a first pixel, a second pixel, a third pixel, and a fourth pixel which overlap the corner area; and
an inorganic layer including an overlapping inorganic pattern and a corner inorganic pattern,
wherein the overlapping inorganic pattern defines a first opening, which is arranged between the first pixel and the second pixel, and a second opening, which is arranged between the third pixel and the fourth pixel,
wherein the corner inorganic pattern surrounds the overlapping inorganic pattern, and
wherein a shape of the first opening is different from a shape of the second opening; and
a cover window arranged on the display panel.

12. The electronic device of claim 11, wherein an area of the first opening in a first plane tangent to a surface of the inorganic layer at the first opening is greater than an area of the second opening in a second plane tangent to the surface of the inorganic layer at the second opening.

13. The electronic device of claim 11, wherein the display panel further comprises a metal pattern overlapping the first opening.

14. The electronic device of claim 11, wherein the first opening is a first alignment mark, and the cover window comprises a second alignment mark.

15. The electronic device of claim 11, wherein the display panel further comprises:

an organic insulating layer arranged between the substrate and the inorganic layer and comprising a hole overlapping the first opening; and a display element layer arranged on the inorganic layer and comprising a plurality of display elements of the plurality of pixels.

16. The electronic device of claim 15, wherein the inorganic layer comprises a protruding tip protruding towards a center of the hole.

17. The electronic device of claim 16, wherein the display panel further comprises an encapsulation layer arranged on the display element layer and comprising an inorganic encapsulation layer and an organic encapsulation layer, wherein the inorganic encapsulation layer directly contacts the protruding tip.

18. The electronic device of claim 11, wherein the corner area comprises a plurality of extension areas respectively extending in a direction away from the central area, and a separation area is defined between adjacent extension areas of the plurality of extension areas.

19. The electronic device of claim 18, wherein the plurality of pixels is arranged along a plurality of lines in the plurality of extension areas, and the first opening extends to cross the plurality of lines.

20. The electronic device of claim 11, wherein the substrate further comprises:

a first area which is adjacent to the central area and bent in a cross-section defined by a first direction and a third direction; and a second area which is adjacent to the central area and bent in a cross-section defined by a second direction crossing the first direction and the third direction, wherein the corner area surrounds at least a part of the first area, the central area, and the second area, and wherein the third direction is normal to a plane defined by the first direction and the second direction.

* * * * *